United States Patent
Fukushi

(10) Patent No.: US 8,213,253 B2
(45) Date of Patent: Jul. 3, 2012

(54) SEMICONDUCTOR MEMORY

(75) Inventor: Isao Fukushi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 72 days.

(21) Appl. No.: 12/696,580

(22) Filed: Jan. 29, 2010

(65) Prior Publication Data

US 2010/0128515 A1    May 27, 2010

Related U.S. Application Data

(63) Continuation of application No. PCT/JP2007/001007, filed on Sep. 14, 2007.

(51) Int. Cl.
*G11C 7/14* (2006.01)
(52) U.S. Cl. ............... 365/210.1; 365/149; 365/210.14
(58) Field of Classification Search ............... 365/149, 365/210.1, 210.14
See application file for complete search history.

(56) References Cited

U.S. PATENT DOCUMENTS

| | | |
|---|---|---|
| 2005/0128784 A1 | 6/2005 | Kawashima et al. |
| 2005/0195639 A1* | 9/2005 | Fukushi et al. ............... 365/149 |
| 2006/0146590 A1 | 7/2006 | Fukushi et al. |
| 2006/0164877 A1 | 7/2006 | Miyamoto et al. |

FOREIGN PATENT DOCUMENTS

| | | |
|---|---|---|
| JP | 2002-133857 A | 5/2002 |
| JP | 2002-157876 A | 5/2002 |
| JP | 2003-109378 | 4/2003 |
| JP | 2006-190395 | 7/2006 |
| JP | 2006-202421 | 8/2006 |
| JP | 2007-184016 A | 7/2007 |
| WO | WO 2004/093088 A1 | 10/2004 |

* cited by examiner

*Primary Examiner* — Hoai V Ho
*Assistant Examiner* — Jay Radke
(74) *Attorney, Agent, or Firm* — Arent Fox LLP

(57) ABSTRACT

A regular capacitor is saturated by an electric charge of a regular memory cell holding a high logic level and is not saturated by an electric charge from the regular memory cell holding a low logic level. A reference capacitor is saturated by the electric charge from a reference memory cell holding the high logic level. A differential sense amplifier differentially amplifies a difference between a regular read voltage read from the regular capacitor and a voltage which is lower by a first voltage than a reference read voltage being a saturation voltage read from the reference capacitor, and generates logic of data held in the memory cell. Accordingly, a difference between the reference voltage and the read voltage corresponding to the low logic level can be made relatively large. As a result, it is possible to improve a read margin.

11 Claims, 21 Drawing Sheets

SEMICONDUCTOR MEMORY

CROSS-REFERENCE TO RELATED APPLICATION

This application is based upon and claims the benefit of the prior International Application No. PCT/JP2007/001007, filed on Sep. 14, 2007, the entire contents of which are incorporated herein by reference.

FIELD

The present embodiment relates to a semiconductor memory having memory cells each including a capacitor which retains logical values of data in the form of electric charges. In particular, the present embodiment relates to a read circuit for reading data that were written to memory cells.

BACKGROUND

A ferroelectric memory composed of memory cells each including a ferroelectric capacitor is developed as a semiconductor memory which has both advantages of DRAMs and flash memories/EEPROMs. The ferroelectric memory operates the ferroelectric capacitor made of ferroelectric material, which is insulated material, as a variable capacitor. The ferroelectric memory can hold data without a power supply, by utilizing remnant polarization which is left even when no voltage is applied to the ferroelectric capacitor. By using this feature, the ferroelectric memory is used as a storage medium such as an IC card and an RFID tag or the like.

A ferroelectric memory of this type compares a read voltage corresponding to electric charge read from the memory cell with a reference voltage, and determines logic value of data held in the memory cell. For example, the reference voltage is set to an average value of a maximum voltage and a minimum voltage of a plurality of the read voltages read to a plurality of bit lines (see, for example, Japanese Laid-open Patent Publication No. 2002-157876).

Further, a ferroelectric memory called a bit line GND sensing technique has recently been proposed (see, for example, Japanese Laid-open Patent Publication No. 2002-133857). This ferroelectric memory has: a pMOS transistor (charge transfer circuit) whose source is coupled to a bit line; and a charge storage circuit connected to a drain of the pMOS transistor. A gate-to-source voltage of the pMOS transistor is initially set to the same value as a threshold voltage before a plate line is activated. In a read operation, when a voltage is applied to the plate line, the pMOS transistor turns on according to an increase in the voltage of the bit line. Consequently, the electric charge read to the bit line from the memory cell is transferred to the charge storage circuit via the pMOS transistor. Then, a logic value of data held in the memory cell is determined according to an electric charge amount transferred to the charge storage circuit.

Generally, a capacitance value of a ferroelectric capacitor is subject to great fluctuation at the time of manufacture. This fluctuation further causes the fluctuation of read voltages corresponding to high logic level and low logic level and of a reference voltage. Accordingly, a difference between the read voltage and the reference voltage fluctuates, which lowers a read margin.

SUMMARY

According to an aspect of the invention, a semiconductor memory includes a regular memory cell having a cell capacitor storing an electric charge corresponding to one of a high logic level and a low logic level; a regular pre-sense amplifier having a regular capacitor which is saturated by the electric charge read from the regular memory cell holding the high logic level and from which a saturation voltage is read, and which is not saturated by the electric charge held in the regular memory cell holding the low logic level and from which a read voltage lower than the saturation voltage is read, and generating a regular read voltage corresponding to the electric charge being stored; a reference memory cell having a cell capacitor storing the electric charge corresponding to the high logic level; a reference pre-sense amplifier having a reference capacitor which is saturated by the electric charge read from the reference memory cell holding the high logic level and from which the saturation voltage is read, and generating the saturation voltage as a reference read voltage; and a differential sense amplifier differentially amplifying a difference between the regular read voltage and a reference voltage which is lower than the reference read voltage by a first voltage to generate logic of data held in the memory cell.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
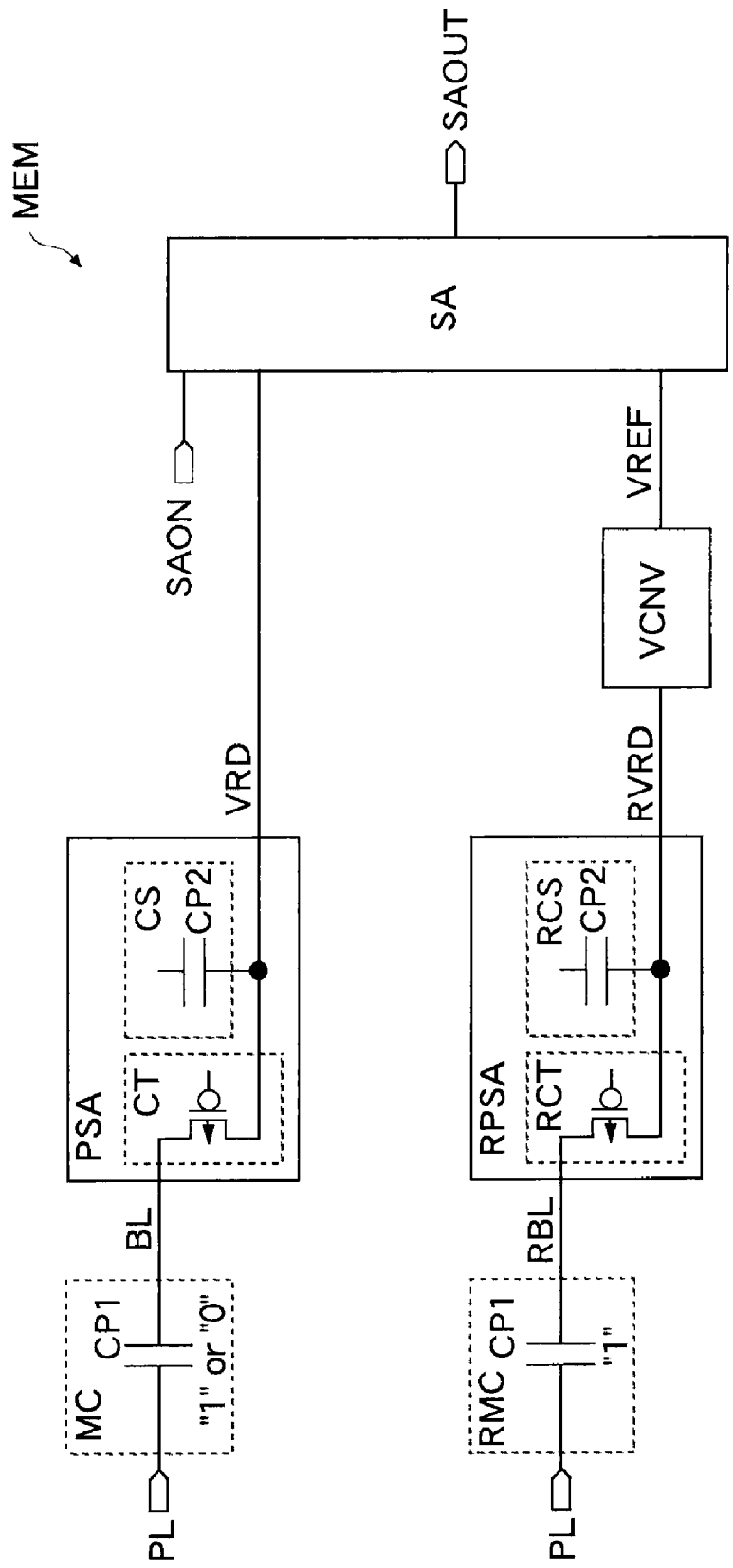
FIG. 1 illustrates a block diagram depicting a first embodiment.

It is a proposition of the present embodiment to improve a read margin in a semiconductor memory having memory cells each including a capacitor. In particular, the proposition is to prevent a read margin from lowering even when a capacitance value of the capacitor fluctuates. Another proposition is to prevent the fluctuation of a reference voltage when the reference voltage is generated by using data held in the memory cells, thereby improving a read margin.

A cell capacitor of a regular memory cell stores an electric charge corresponding to a high logic level or a low logic level. A cell capacitor of a reference memory cell stores the electric charge corresponding to the high logic level. A regular pre-sense amplifier has a regular capacitor and generates a regular read voltage corresponding to the electric charge stored in the regular capacitor. The regular capacitor is saturated by the electric charge read from the regular memory cell holding the high logic level. At this time, a saturation voltage is read from the regular capacitor. The regular capacitor is not saturated by the electric charge held in the regular memory cell holding the low logic level. At this time, a regular read voltage lower than the saturation voltage is read from the regular capacitor. A reference pre-sense amplifier has a reference capacitor which is saturated by the electric charge read from the reference memory cell holding the high logic level and from which the saturation voltage is read, and generates the saturation voltage as a reference read voltage. A differential sense amplifier differentially amplifies a difference between the regular read voltage and a reference voltage, which is lower than the reference read voltage by a first voltage, to generate logic value of data held in the memory cell.

Since the regular read voltage corresponding to the high logic level and the reference read voltage are the saturation voltage, their fluctuation is small. In other words, even when characteristics of the capacitors of the regular memory cell and the reference memory cell fluctuate, it is possible to reduce the fluctuation of the regular read voltage and the reference read voltage. This can also reduce the fluctuation of the reference voltage which is lower than the reference read voltage by the first voltage. Accordingly, the fluctuation of the difference between the regular read voltage corresponding to the high logic level and the reference voltage can be reduced, which allows the first voltage to be set to the minimum value. Since the first voltage can be set to the minimum value, it is possible to make the difference between the reference voltage and the regular read voltage corresponding to the low logic level relatively large. As a result, the sense amplifier is capable of surely differentially amplifying the difference between the reference voltage and the regular read voltage. That is, a read margin can be improved.

For example, the regular pre-sense amplifier has a regular charge transfer circuit coupled to a regular bit line and a regular charge storage circuit including the regular capacitor. The regular charge storage circuit is coupled to the regular charge transfer circuit via a regular read node, and stores the electric charge which is read from the regular memory cell to the regular bit line during a read operation, and generates the regular read voltage at the regular read node according to the stored electric charge. The reference pre-sense amplifier has a reference charge transfer circuit coupled to a reference bit line and a reference charge storage circuit including the reference. The reference charge storage circuit is coupled to the reference charge transfer circuit via a reference output node, and stores the electric charge corresponding to the high logic level which is read from the reference memory cell to the reference bit line during the read operation, and generates the reference read voltage at the reference read node according to the stored electric charge. A voltage conversion circuit generates the reference voltage which is lower than the reference read voltage by the first voltage, based on the reference read voltage.

For example, dummy memory cells are each coupled to the regular bit line and the reference bit line and each output electric charges to the regular bit line and the reference bit line during the read operation. For example, the dummy memory cells store the electric charges corresponding to the low logic level. Due to the dummy memory cells, an electric charge amount read to the bit lines during the read operation increases. This makes it possible to increase the regular read voltage corresponding to the high logic level and the reference read voltage up to the saturation voltage. This, as result, allows the first voltage to be set to the minimum value, and thus makes it possible to make the difference between the reference voltage and the regular read voltage corresponding the low logic level large. That is, the read margin can be improved.

For example, a regular level shifter is coupled to the regular pre-sense amplifier and generates a regular shift voltage of which the regular read voltage is shifted by a predetermined value. A reference level shifter is coupled to the reference pre-sense amplifier and generates a reference shift voltage of which the reference read voltage is shifted by the predetermined value. The voltage conversion circuit generates the reference voltage which is lower than the reference shift voltage by the first voltage. The differential sense amplifier receives the regular shift voltage as the regular read voltage and differentially amplifies a difference between the regular shift voltage and the reference voltage. The level shifters are capable of converting the regular read voltage and the reference voltage to values that can be differentially amplified by the sense amplifier. As a result, an operating margin of the sense amplifiers can be increased, which can improve the read margin.

For example, in addition to the reference memory cell having a cell capacitor holding the high logic level, the semiconductor memory may have another cell capacitor formed in the reference memory cell and storing the electric charge corresponding to the low logic level, a reference bit line coupled to the cell capacitor corresponding to the low logic level, a reference pre-sense amplifier coupled to the reference bit line corresponding to the low logic level, and a reference level shifter coupled to the reference pre-sense amplifier corresponding to the low logic level. That is, the reference memory cell stores complementary data. A pair of the reference bit lines, a pair of the reference pre-sense amplifiers, and a pair of the reference level shifters are formed in correspondence to the pair of cell capacitors of the reference memory cell.

The regular level shifter has a regular capacitor whose one end is coupled to the regular read node, a regular source follower transistor having a gate coupled to another end of the regular capacitor and outputting the regular shift voltage from a source, and a regular load circuit coupled to the source of the regular source follower transistor. Each of the reference level shifters has a reference capacitor whose one end is coupled to the reference read node corresponding thereto, a reference source follower transistor having a gate coupled to another end of the reference capacitor and outputting the reference shift voltage from a source, and a reference load circuit coupled to the source of the reference source follower transistor.

The voltage conversion circuit has a pair of source follower circuits which are coupled to a pair of the reference level shifters respectively and whose outputs are coupled to each other. Each of the source follower circuits has a source follower transistor having a gate coupled to another end of the reference capacitor corresponding thereto and outputting the reference voltage from a common output, and a load circuit coupled to a source of the source follower transistor corresponding thereto. Since the outputs of the pair of the source follower circuits are coupled to each other, the reference voltage is set to a voltage output by the source follower circuits corresponding to the cell capacitors (the reference memory cells) holding the high logic level out of the pair of the source follower circuits. Further, since a pair of load circuits are coupled in parallel to the one of the source follower circuits, the reference voltage can be surely set to a value which is lower than the regular read voltage corresponding to the high logic level by the first voltage. This allows the first voltage to be set to the minimum value as described above, which can improve a read margin.

For example, the semiconductor memory has a differential sense amplifier differentially amplifying a difference between the reference shift voltage output from each of the pair of the reference level shifters, and generating logic of data held in the reference memory cell. Consequently, it is possible to write data supplied from an external part of the semiconductor memory not only to the regular memory cell but also to the reference memory cells.

For example, the regular load circuit is a transistor whose gate is coupled to the regular read node. The load circuit of each of the source follower circuits and the reference load circuit are each a transistor whose gate is coupled to the reference read node.

Hereinafter, embodiments will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by the same reference symbols as the names of the terminals. Signal lines for transmitting signals are designated by the same reference symbols as the names of the signals. Signals ending in "X" and signals heading in "/" are of negative logic.

FIG. 1 illustrates a first embodiment. A semiconductor memory MEM has a regular memory cell MC, a regular pre-sense amplifier PSA coupled to the regular memory cell MC via a regular bit line BL, a reference memory cell RMC, a reference pre-sense amplifier RPSA coupled to the reference memory cell RMC via a reference bit line RBL, a voltage conversion circuit VCNV coupled to the reference pre-sense amplifier RPSA, and a differential sense amplifier SA. It should be noted that the actual semiconductor memory MEM has a plurality of real memory cells MC. The reference memory cell RMC is formed for each of a predetermined number of the real memory cells MC. The regular pre-sense amplifier PSA and the reference pre-sense amplifier RPSA may be formed by the same circuits as those in FIG. 8 and FIG. 9 to be described later, for instance.

The regular memory cell MC has a cell capacitor CP1 whose one end and another end are coupled to a plate line PL and the bit line BL. For example, the cell capacitor CP1 is formed as a variable capacitor by using a ferroelectric material and an oxide film. The capacitor CP1 of the memory cell MC is set to such a capacitance value that enables the capacitor CP1 to store an electric charge corresponding to high logic level "1" or low logic level "0" by a write operation. The regular memory cell MC holds data supplied from an external part of the semiconductor memory MEM. The structure of the reference memory cell RMC is, for example, the same as that of the regular memory cell MC. A cell capacitor CP1 of the reference memory cell RMC is set to such a capacitance value that enables the cell capacitor CP1 to constantly store an electric charge corresponding to the high logic level "1". For example, in the write operation of the memory cell MC, the high logic level "1" is always written to the reference memory cell RMC. Hereinafter, the high logic level "1" and the low logic level "0" will be also referred to as data "1" and data "0".

The regular pre-sense amplifier PSA has a regular charge transfer circuit CT coupled to the regular bit line BL and a regular charge storage circuit CS coupled to the regular charge transfer circuit CT via a regular read node VRD. The charge transfer circuit CT has, for example, a pMOS transistor whose source and drain are coupled to the bit line BL and the read node VRD respectively. A gate voltage of the pMOS transistor is set so that a gate-to-source voltage becomes substantially equal to a threshold voltage of the pMOS transistor. Consequently, when the electric charge is read from the memory cell MC to the bit line BL and a voltage of the bit line BL increases, the pMOS transistor turns on and the electric charge on the bit line BL is transferred to the read node VRD. By the transfer of the electric charge, the voltage of the bit line BL is kept at a voltage that it has at the beginning of the read operation (for example, a ground voltage).

The charge storage circuit CS has a capacitor CP2 whose one end is coupled to the read node VRD, in order to store the electric charge which is read from the memory cell MC to the bit line BL during the read operation. Though not particularly shown, for example, another end of the capacitor CP2 is coupled to a control signal line which is set to low level during the read operation. The charge storage circuit CS generates a regular read voltage at the read node VRD according to the electric charge stored in the capacitor CP2.

The reference pre-sense amplifier RPSA has the same circuit configuration as that of the regular pre-sense amplifier PSA and has a reference charge transfer circuit RCT and a reference charge storage circuit RCS. The charge transfer circuit RCT has, for example, a pMOS transistor whose source and drain are coupled to a reference bit line RBL and a reference read node RVRD respectively. The charge storage circuit RCS has a capacitor CP2 whose one end is coupled to the reference read node RVRD, in order to store the electric charge which is read from the reference memory cell RMC to the reference bit line RBL during the read operation. The charge storage circuit RCS generates a reference read voltage at the reference read node RVRD according to the electric charge stored in the capacitor CP2.

The voltage conversion circuit VCNV receives the reference read voltage RVRD to generate a reference voltage VREF which is lower than the reference read voltage RVRD by a first voltage (for example, 100 mV). The differential sense amplifier SA differentially amplifies a difference between the regular read voltage VRD and the reference voltage VREF, latches a value resulting from the differential amplification as a logic value of data held in the regular memory cell MC, and outputs the latched logic value as an output signal SAOUT. The differential sense amplifier SA starts the differential amplification in synchronization with a change of a sense amplifier activation signal SAON (corresponding to a timing signal T6 of a fourth embodiment to be described later) to high level.

Figure 2:
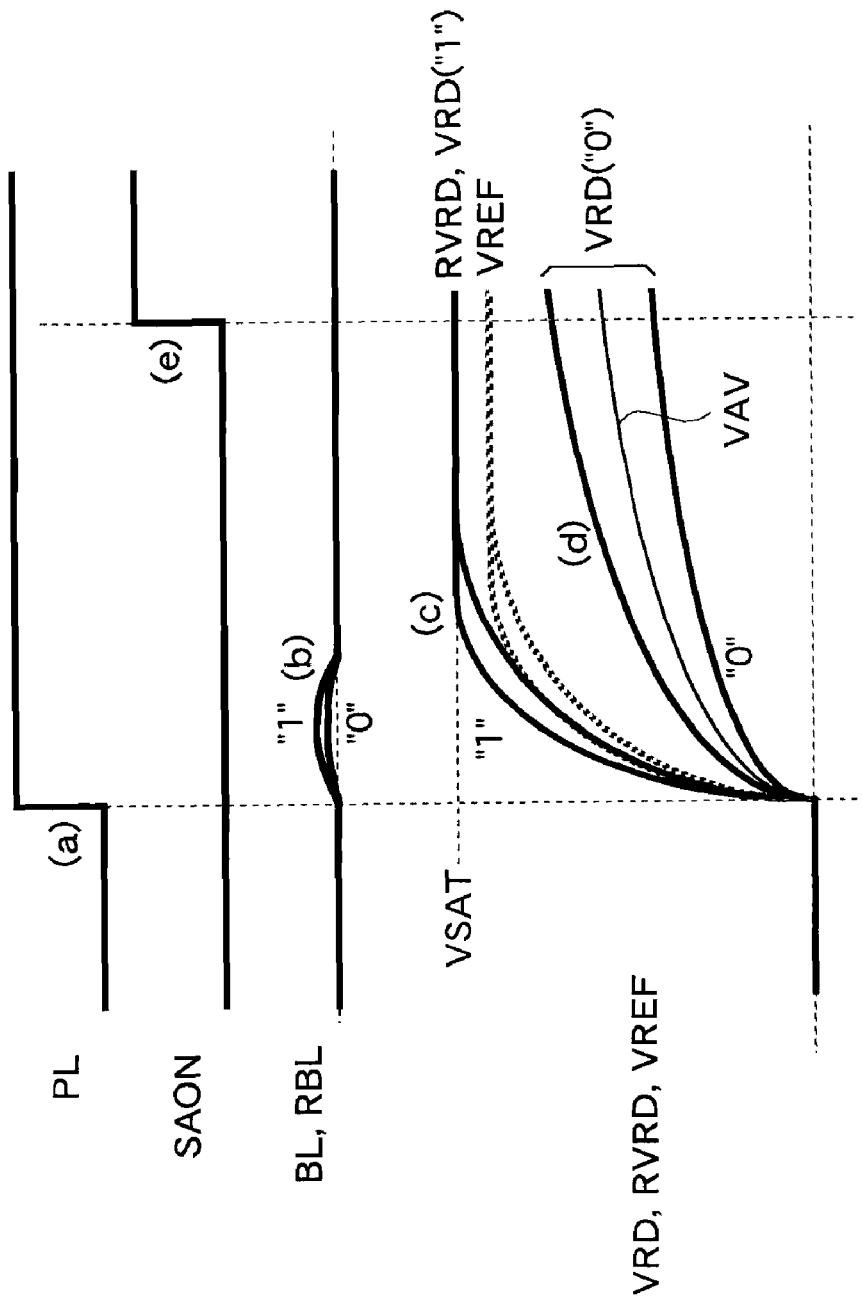
FIG. 2 illustrates a timing chart depicting a read operation to the first embodiment.

FIG. 2 illustrates the read operation of the first embodiment. In the read operation, first, the plate line PL changes to high level (FIG. 2 (a)). In response to the change in the plate line PL, electric charges are read from the memory cells MC, RMC to the bit lines BL, RBL respectively (FIG. 2 (b)). When data "1" is stored in the memory cell MC, an electric charge amount read to the bit line BL is relatively large. When data "0" is stored in the memory cell MC, an electric charge amount read to the bit line BL is relatively small. Since data "1" is always stored in the memory cell RMC, an electric charge amount read from the memory cell RMC to the bit line RBL is equal to the electric charge amount read to the bit line BL from the memory cell MC storing the data "1".

When voltages of the bit lines BL, RBL increase, the charge transfer circuits CT, RCT operate. The electric charges of the bit lines BL, RBL are transferred to and stored in the charge storage circuits CS, RCS, and voltages of the read nodes VRD, RVRD increase. Here, the capacitors CP2 of the charge storage circuits CS, RCS are designed to have capacitance values so that they are saturated by the electric charges read from the memory cells MC, RMC holding the data "1" and are not saturated by the electric charge read from the memory cell MC holding the data "0". Therefore, the voltages of the read nodes VRD, RVRD reach a saturation voltage VSAT which is an upper limit value of the read voltages VRD, RVRD, due to the electric charges read from the memory cells MC, RMC holding the data "1" (FIG. 2 (c)). Two lines representing the read voltages VRD ("1") and RVRD indicate voltage fluctuations. For example, the occurrences of the fluctuations are ascribable to the fluctuations of the capacitance values of the capacitors CP1 of the memory cells MC, RMC. The fluctuations of the read voltages VRD ("1") and RVRD differ depending on how much time has passed from the activation of the plate line PL. Concretely, the fluctuations gradually increase with time and thereafter decrease by the time when they reach the saturation voltage VSAT. The fluctuations after they reach the saturation voltage VSAT are extremely small.

On the other hand, the electric charge read from the memory cell MC holding the data "0" does not cause the read voltage VRD to reach the saturation voltage VSAT (FIG. 2 (d)). The fluctuation of the read voltage VRD ("0") corresponding to the data "0" increases with time. The occurrence of this fluctuation is also ascribable to the fluctuation of the capacitance value of the capacitor CP1 of the memory cell MC, for instance. In consideration of the fluctuation of the read voltage VRD corresponding to the data "0", a difference between the read voltage VRD (average value VAV) corresponding to the data "0" and the reference voltage VREF is set larger than a difference between the read voltage VRD corresponding to the data "1" and the reference voltage VREF.

The voltage conversion circuit VCNV generates the reference voltage VREF which is slightly lower than the read voltage RVRD (saturation voltage VSAT) and higher than the read voltage VRD corresponding to the data "0". Since the reference voltage VREF is generated by using only the read voltage RVRD corresponding to the data "1", the fluctuation of the difference (first voltage) between the read voltages RVRD, VRD and the reference voltage VREF is small. In other words, even when characteristics of the capacitors CP1 of the regular memory cell MC and the reference memory cell RMC fluctuate, the reference voltage VREF which is lower than the read voltages VRD ("1") and RVRD by the first voltage can be generated with high accuracy.

After the read voltages VRD, RVRD reach the saturation voltage VSAT, the sense amplifier activation signal SAON is changed to high level, so that the sense amplifier SA starts an amplifying operation (FIG. 2 (e)). The sense amplifier SA is capable of differentially amplifying the difference having a small fluctuation, between the read voltage VRD ("1") and the reference voltage VREF without fail, or the sense amplifier SA is capable of differentially amplifying the difference (large voltage difference) between the read voltage VRD ("0") and the reference voltage VREF without fail. Then, as described above, the output signal SAOUT is generated.

In the first embodiment described above, it is possible to reduce the fluctuation of the first voltage which is the difference between the regular read voltage VRD corresponding to the data "1" and the reference voltage VREF. Therefore, it is possible to make the difference between the reference voltage VREF and the regular read voltage VRD corresponding to the data "0" relatively large. This, as a result, makes it possible to differentially amplify the difference between the reference voltage VREF and the regular read voltage VRD without fail, which can improve a read margin. In other words, even when the capacitance values of the capacitors CP1 of the memory cells MC, RMC fluctuate or change, it is possible to prevent a read margin from lowering.

Figure 3:
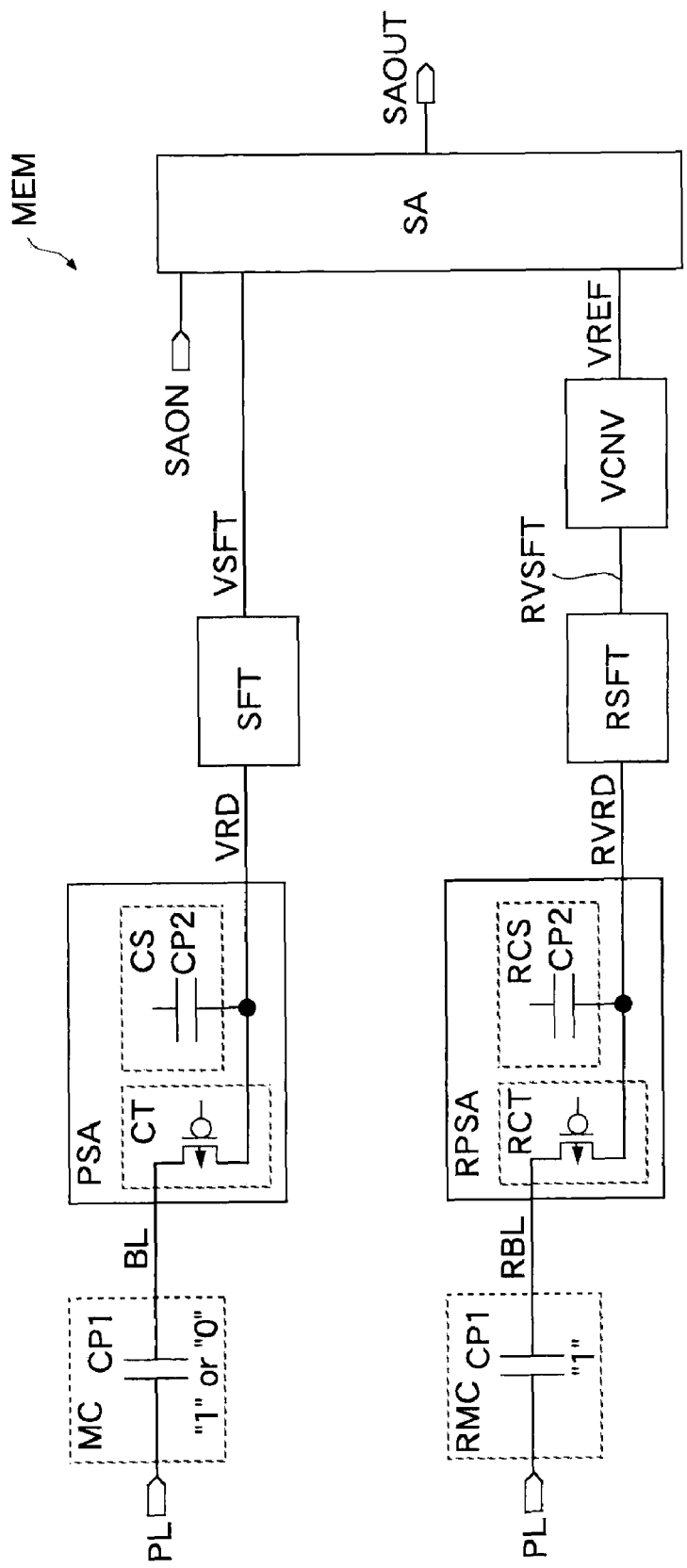
FIG. 3 illustrates a block diagram depicting a second embodiment.

FIG. 3 illustrates a second embodiment. The same elements as those described in the first embodiment will be designated by identical reference numbers or symbols, and detailed description thereof will be omitted. In this embodiment, a regular level shifter SFT and a reference level shifter RSFT are added to the first embodiment. For example, the level shifters SFT, RSFT convert read voltages VRD, RVRD to voltages that can be input to a differential sense amplifier SA. The other structure is the same as that of the first embodiment.

The level shifter SFT is coupled to a regular pre-sense amplifier PSA and generates a regular shift voltage VSFT by shifting the regular voltage VRD by a predetermined value. The level shifter RSFT is coupled to a reference pre-sense amplifier RPSA and generates a reference shift voltage RVSFT by shifting the read voltage RVRD by a predetermined value. A voltage conversion circuit VCNV generates a reference voltage VREF which is lower than the reference shift voltage RVSFT by a first voltage (for example, 100 mV). The level shifters SFT, RSFT are the same circuits. Therefore, the aforesaid predetermined values are equal to each other, and a difference between the shift voltage VSFT and the read voltage VRD is equal to a difference between the shift voltage RVSFT and the read voltage RVRD.

A sense amplifier SA receives the regular shift voltage VSFT as a regular read voltage, differentially amplifies a difference between the regular shift voltage VSFT and the reference voltage VREF, and outputs a logic value generated by the amplification, as an output signal SAOUT.

Figure 4:
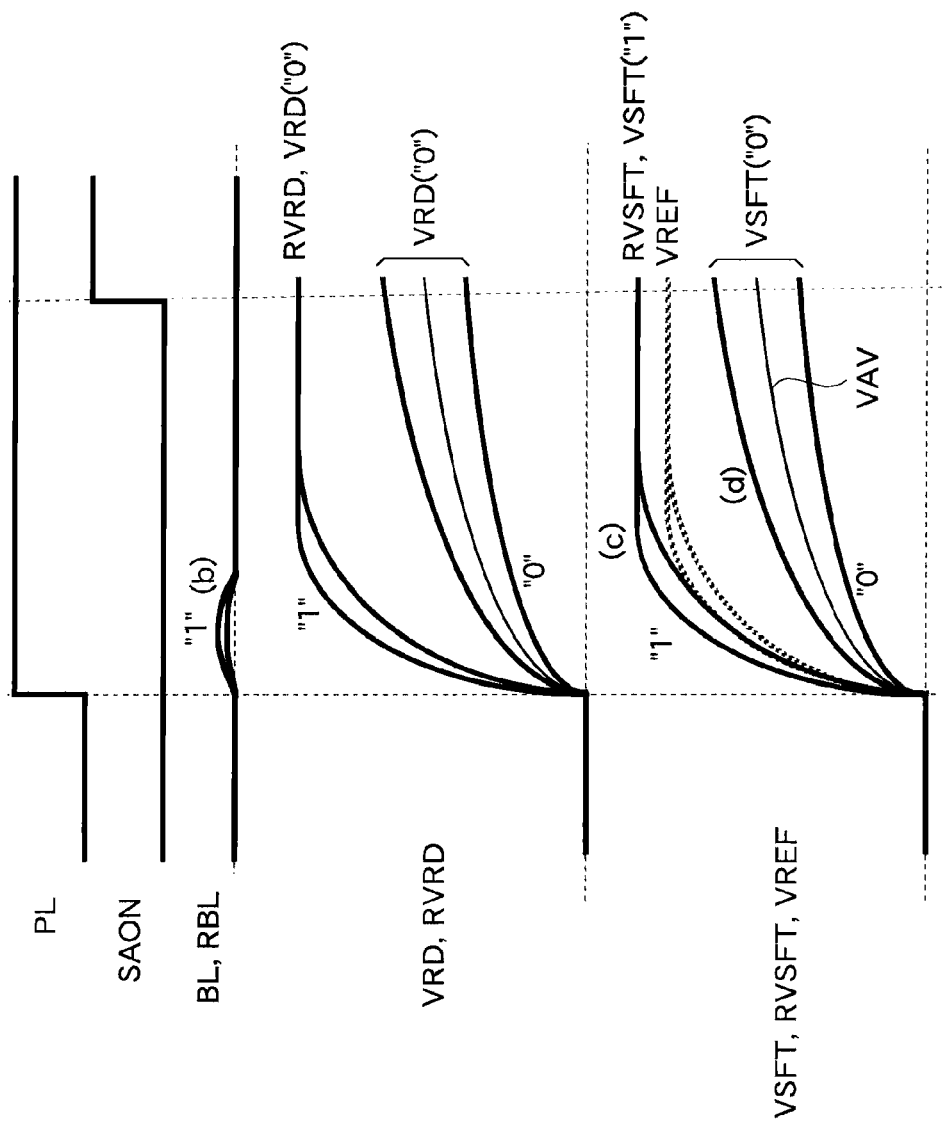
FIG. 4 illustrates a timing chart depicting a read operation to the second embodiment.

FIG. 4 illustrates a read operation of the second embodiment. Detailed description of the same operations as those of the first embodiment will be omitted. In this embodiment, for example, the read voltages VRD, RVRD are negative voltages. The level shifters SFT, RSFT convert the negative read voltages VRD, RVRD to the positive shift voltages VSFT, RVSFT. Relations (voltage differences) between the shift voltages VSFT ("1"), RVSFT, VSFT ("0") and the reference voltage VREF are the same as the relations between the read voltages VRD ("1"), RVRD, VRD ("0") and the reference voltage VREF of the first embodiment (FIG. 2).

The second embodiment described above can also provide the same effect as that of the first embodiment described above. In addition, in this embodiment, the level shifters SFT, RSFT are capable of converting the regular read voltage VRD and the reference voltage VREF to values that can be differentially amplified by the sense amplifier SA. As a result, an operating margin of the sense amplifier SA can be increased, which can improve a read margin.

Figure 5:
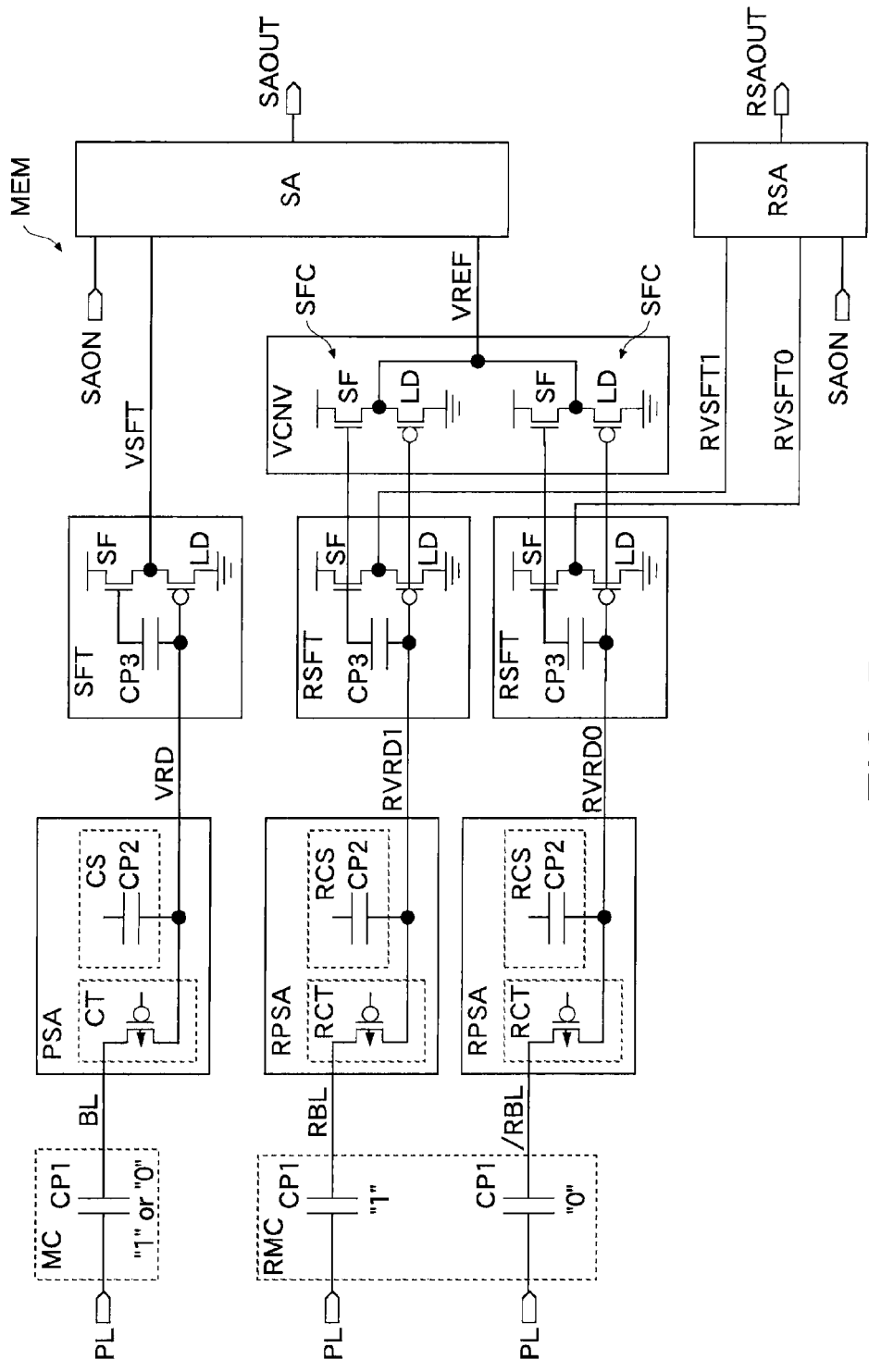
FIG. 5 illustrates a block diagram depicting a third embodiment.

FIG. 5 illustrates a third embodiment. The same elements as those described in the first and second embodiments will be designated by identical reference numbers or symbols, and detailed description thereof will be omitted. In this embodiment, a semiconductor memory MEM has a reference memory cell RMC having a pair of capacitors CP1 holding complementary logic levels "1", "0" respectively, in place of the reference memory cell RMC of the embodiment of the second embodiment. A reference pre-sense amplifier RPSA and a reference level shifter RSFT are formed for each of the capacitors CP1 of the reference memory cell RMC. A voltage conversion circuit VCNV is coupled to the pair of reference level shifters RSFT. The semiconductor memory MEM further has a differential sense amplifier RSA for reading logic values of data held in the reference memory cell RMC. That is, in this embodiment, the memory MEM holds data supplied from an external part not only in a regular memory cell MC but also in the reference memory cell RMC. The other structure is the same as that of the second embodiment.

A level shifter SFT has a regular capacitor CP3, a regular source follower transistor SF, and a regular load circuit LD (current source). One end of the regular capacitor CP3 is coupled to a regular read node VRD. The regular source follower transistor SF (nMOS transistor) has an input (gate) coupled to another end of the regular capacitor CP3 and a drain coupled to a voltage line such as a power supply line, and outputs a regular shift voltage VSFT from an output (source). The regular load circuit LD (pMOS transistor) has an input (gate) coupled to the read node VRD, a drain coupled to a voltage line such as a ground line, and a source coupled to the source (VSFT) of the regular source follower transistor SF.

When a pre-sense amplifier PSA operates at the time of a read operation and a read voltage VRD increases due to an electric charge transferred from a bit line BL, a gate voltage of the regular source follower transistor SF increases due to a coupling action of the regular capacitor CP3. In accordance with the increase in the gate voltage, the regular shift voltage VSFT follows the read voltage VRD to increase. Consequently, for example, the read voltage VRD being a negative voltage can be converted to a positive voltage that can be input to a sense amplifier SA.

The reference level shifters RSFT each are the same circuit as the regular level shifter SFT. That is, the reference level shifters RSFT each have a reference capacitor CP3 whose one end is coupled to a reference read node RVRD1 or RVRD0, a reference source follower transistor SF, and a reference load circuit LD (current source). The reference source follower transistor SF has an input (gate) coupled to another end of the reference capacitor CP3 and a drain coupled to the voltage line such as the power supply line, and outputs a reference shift voltage RVSFT1 or RVSFT0 from an output (source). The reference load circuit LD (pMOS transistor) has an input (gate) coupled to the read node RVRD1 or RVRD0, a drain coupled to the voltage line such as the ground line, and a source coupled to the source (RVSFT) of the reference follower transistor SF. The operation of the level shifters RSFT is the same as the operation of the level shifter SFT.

The voltage conversion circuit VCNV has a pair of source follower circuits SFC which are coupled to the pair of reference level shifters RSFT and whose outputs are coupled to an output node of a reference voltage VREF. Each of the source follower circuits SFC has a source follower transistor SF and a load circuit LD coupled to the source follower transistor SF. The source follower transistor SF has an input (gate) coupled to another end of the corresponding regular capacitor CP3, a drain coupled to the voltage line such as the power supply line, and an output (source) coupled to the output node of the reference voltage VREF. The load circuit LD (pMOS transistor) has an input (gate) coupled to the read node RVRD1 or RVRD0, a drain coupled to the voltage line such as the ground line, and a source coupled to the source (VREF) of the regular source follower transistor SF.

Following the read voltage RVRD1 or RVRD0, each of the source follower circuits SFC outputs a level-converted voltage to the node VREF. The output nodes VREF of the source follower circuits SFC are coupled to each other. Therefore, the reference voltage VREF is determined by the operation of the source follower transistor SF that corresponds to the memory cell RMC holding data "1" and having a higher gate voltage. However, the two load circuits LD are coupled in parallel to the source follower transistor SF whose gate voltage is high. Therefore, a current flowing in the pair of source follower circuits SFC is twice as high as that flowing in the single source follower circuit SFC. Therefore, the reference voltage VREF becomes lower than the shift voltage VSFT corresponding to the memory cell MC holding data "1" by a first voltage.

The sense amplifier RSA is the same circuit as the sense amplifier SA. The sense amplifier RSA differentially amplifies a difference between the reference shift voltages RVSFT1, RVSFT0, latches a value resulting from the differential amplification, as a logic value of data held in the reference memory cell RMC, and outputs the latched logic value as an output signal RSAOUT.

Figure 6:
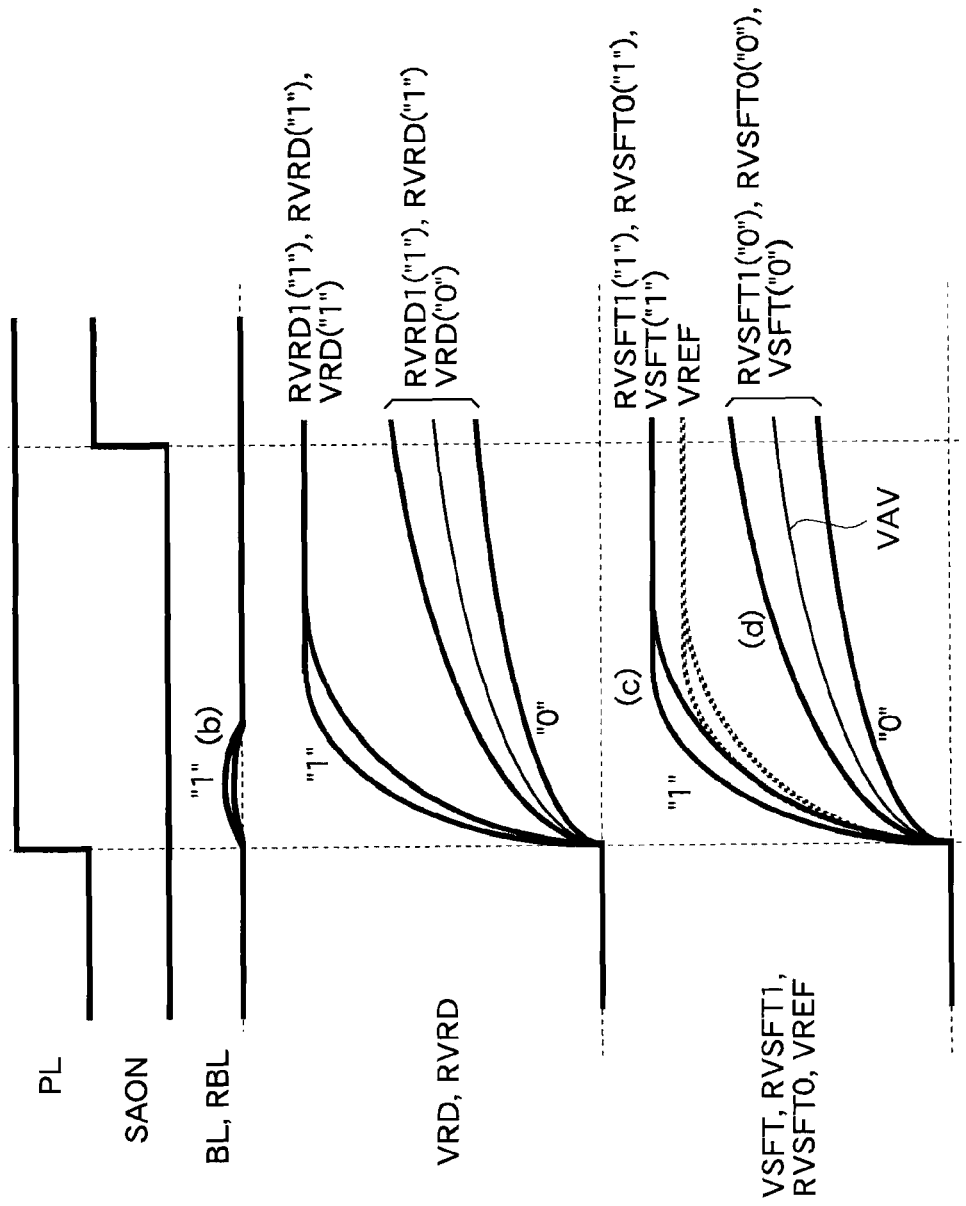
FIG. 6 illustrates a timing chart depicting a read operation to the third embodiment.

FIG. 6 illustrates a read operation of the third embodiment. Values of the reference shift voltages RVSFT1 ("1"), RVSFT0 ("1") are the same as a value of the shift voltage VSFT ("1"). Values of the reference shift voltages RVSFT1 ("0"), RVSFT0 ("0") are the same as a value of the shift voltage VSFT ("0"). Since the sense amplifier RSA corresponding to the reference memory cell RMC differentially amplifies a sufficiently large voltage difference (the difference between the reference shift voltages RVSFT1, RVSFT0), it is possible to surely read the logic value of the data held in the memory cell RMC. The other waveforms are the same as those of the second embodiment (FIG. 4).

In this embodiment, as described above, the voltage conversion circuit VCNV includes the pair of source follower circuits SFC whose output nodes VREF are coupled to each other. Therefore, it is possible to surely set the value of the reference voltage VREF to a voltage lower than the shift voltage VSFT ("1") by the first voltage. The first voltage is about 200 mV, for instance.

The third embodiment described above can also provide the same effects as those of the first and second embodiments described above. Moreover, in this embodiment, since the voltage conversion circuit VCNV includes the pair of source follower circuits SFC, the reference voltage VREF which is lower than the shift voltage VSFT ("1") by the first voltage can be generated with high accuracy. This allows the first voltage to be set to the minimum value, which can improve a read margin. Further, it is possible to write data supplied from an external part of the semiconductor memory MEM not only to the regular memory cell MC but also to the reference memory cell RMC.

Figure 7:
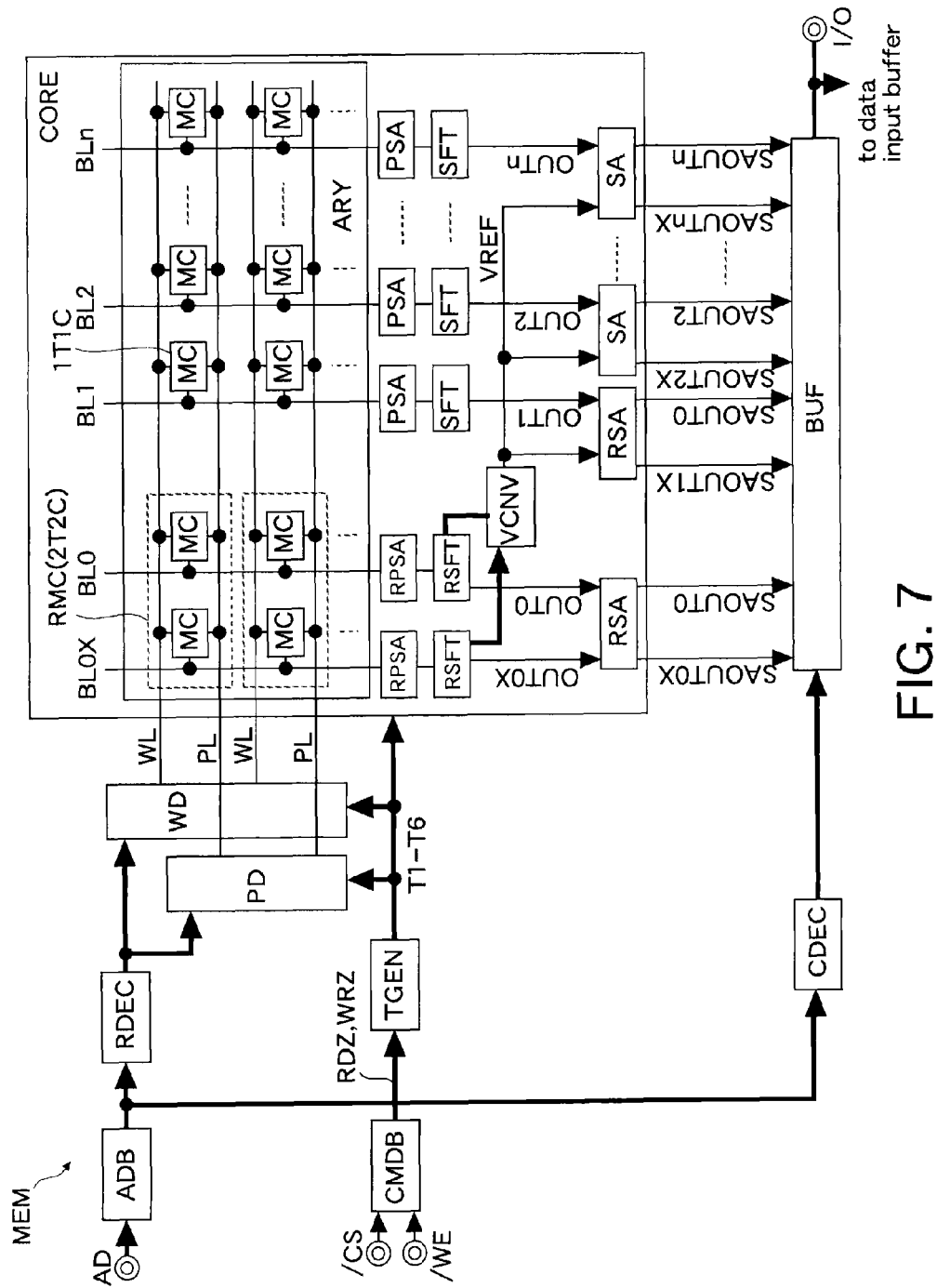
FIG. 7 illustrates a block diagram depicting a fourth embodiment.

FIG. 7 illustrates a forth embodiment. The same elements as those described in the embodiments will be designated by identical reference numbers or symbols, and detailed description thereof will be omitted. In this embodiment, the semiconductor memory MEM is formed as a ferroelectric memory on a silicon substrate by using CMOS processes. The ferroelectric memory is used, for example, as a storage medium such as an IC card or an RFID tag or as a work memory of a portable terminal such as a mobile phone. The ferroelectric memory has an address buffer ADB, a command buffer CMDB, a row decoder RDEC, a timing generation circuit TGEN, a column decoder CDEC, a plate driver PD, a word driver WD, a memory core CORE, and a data output buffer BUF. FIG. 7 chiefly shows those circuits necessary for a read operation. Thus, circuits necessary for a write operation, such as a data input buffer and a write amplifier, are omitted from the diagram.

The address buffer ADB receives an address signal AD through an address terminal, and outputs the received signal to the row decoder RDEC and the column decoder CDEC. The row decoder RDEC decodes high-order bits (row address) of the address signal to generate a row decoding signal, and outputs the generated signal to the word driver WD and the plate driver PD. The column decoder CDEC decodes low-order bits (column address) of the address signal to generate a column decoding signal, and outputs the generated signal to the data output buffer BUF or the like.

The command buffer CMDB receives command signals such as a chip select signal /CS and a write enable signal /WE through command terminals, decodes the received signals and outputs a read signal RDZ or a write signal WRZ to the timing generation circuit TGEN. The timing generation circuit TGEN receives the read signal RDZ or the write signal WRZ and sequentially outputs such as timing signals T1-T5 for operating the plate driver PD, the word driver WD, the data output buffer BUF, pre-sense amplifiers PSA and sense amplifier SA or the like and a timing signals T6 for operating the sense amplifier SA.

The plate driver PD selects a predetermined plate line PL in response to the timing signal from the timing generation circuit TGEN and the row decoding signal from the row decoder RDEC. The selected plate line PL is held in high level for a predetermined period. The word driver WD selects a predetermined word line WL in response to the timing signal from the timing generation circuit TGEN and the row decoding signal from the row decoder RDEC. The selected word line WL is held in high level for a predetermined period.

Figure 8:
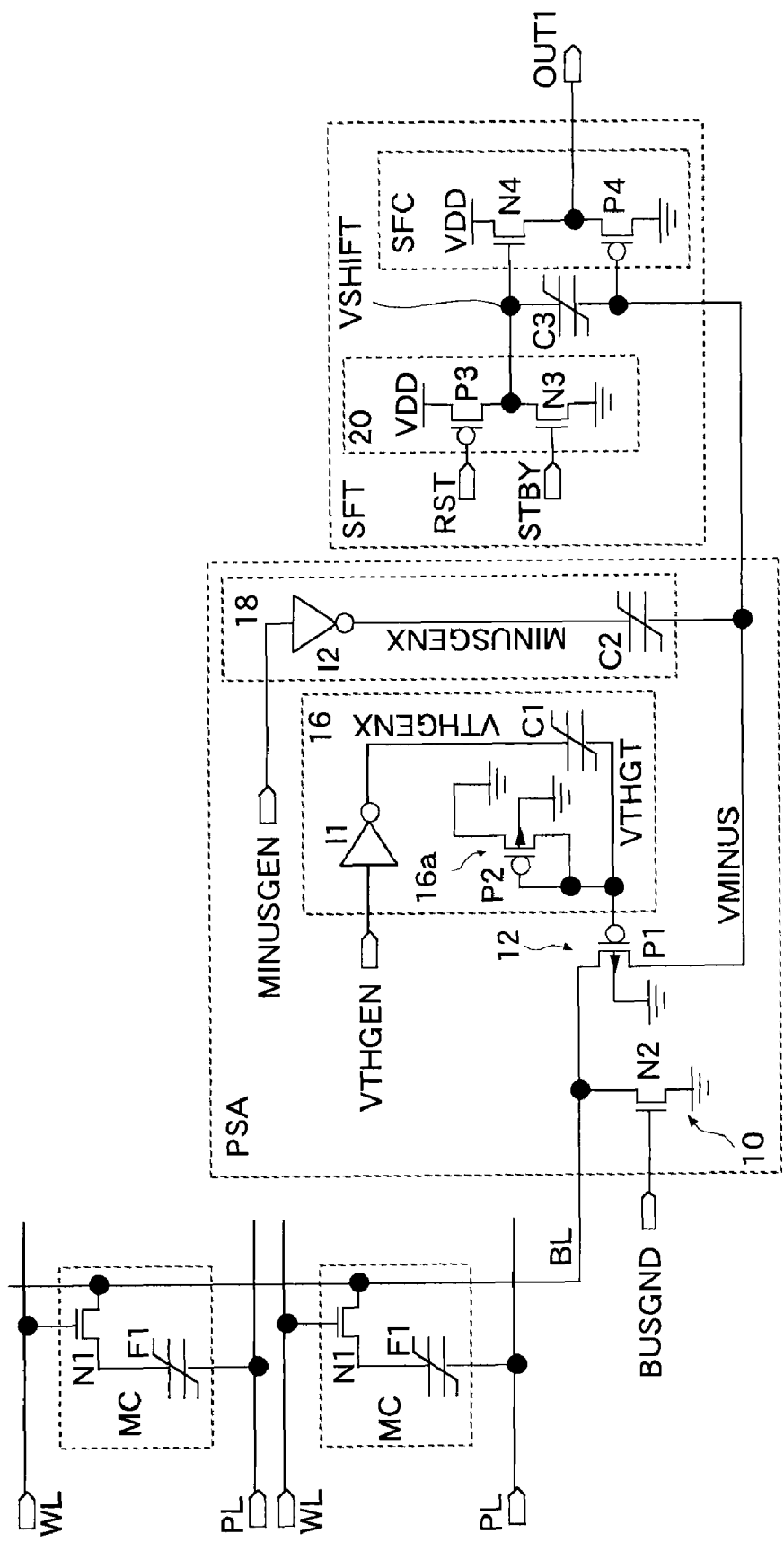
FIG. 8 illustrates a circuit diagram depicting the details of the regular memory cells, the regular pre-sense amplifier and the regular level shifter illustrated in FIG. 7.

The memory core CORE has a memory cell array ARY, the regular pre-sense amplifiers PSA (bit line GND sensing circuits), reference pre-sense amplifiers RPSA (bit line GND sensing circuits), regular level shifters SFT, reference level shifters RSFT, a voltage conversion circuit VCNC, the regular sense amplifiers SA, and reference sense amplifiers RSA. The memory cell array ARY has a plurality of memory cells MC arranged in matrix. The memory cells MC coupled to a regular bit line pair BL (BL0, BL1, . . . BLn) are regular memory cells. The regular memory cells are of a so-called 1T1C type as shown in FIG. 8. Reference memory cells RMC each include a pair of memory cells MC coupled to complementary reference bit lines BL0X, BL0. The reference memory cells RMC are of a so-called 2T2C type. The pair of memory cells MC in each of the reference memory cells RMC store data supplied via a data input/output terminal I/O, as complementary logic levels. In the description below, the regular memory cells will be also referred to as "regular memory cells MC".

Figure 9:
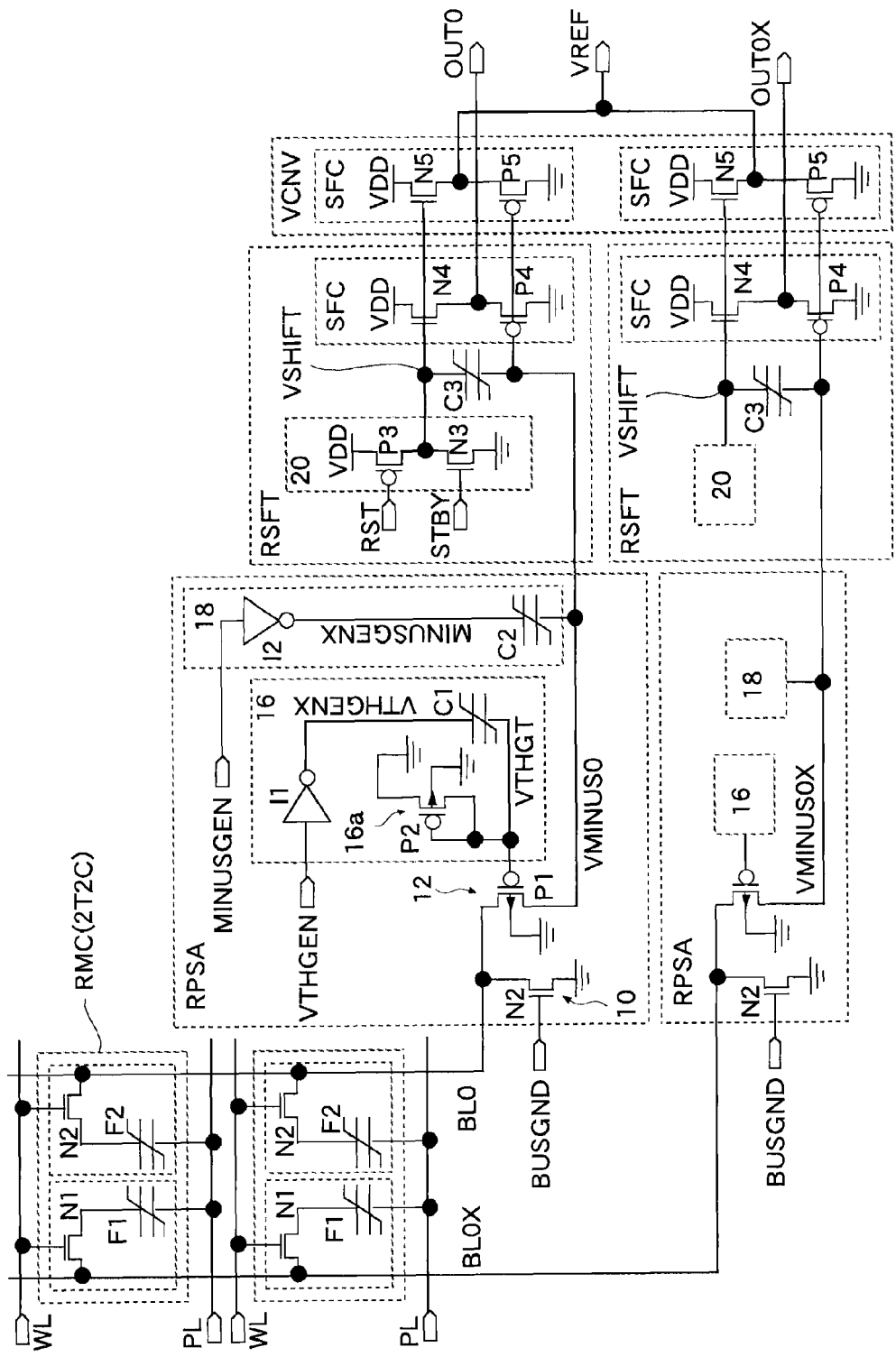
FIG. 9 illustrates a circuit diagram depicting the details of the reference memory cells, the reference pre-sense amplifiers, the reference level shifters and the voltage conversion circuit illustrated in FIG. 7.

The memory cells MC arranged in a lateral direction in the drawing are coupled to a common word line WL and plate line PL. The memory cells MC arranged in a vertical direction in the drawing are coupled to the bit line BL, BL0 or BL0X. The pre-sense amplifiers PSA, RPSA each generate a read voltage according to an electric charge read from the memory cell MC to the bit line BL, BL0, or BL0X during a read operation. The level shifters SFT each shift the read voltage from the pre-sense amplifier PSA by a predetermined value to generate an output signal OUT (OUT1, 2, . . . n; regular shift voltage). The level shifters RSFT shift the read voltages from the pre-sense amplifiers RPSA by a predetermined value to generate output signals OUT0, OUT0X (reference shift voltages). The voltage conversion circuit VCNV generates a reference voltage VREF according to the output voltages from the level shifters RSFT as shown in FIG. 9.

Figure 10:
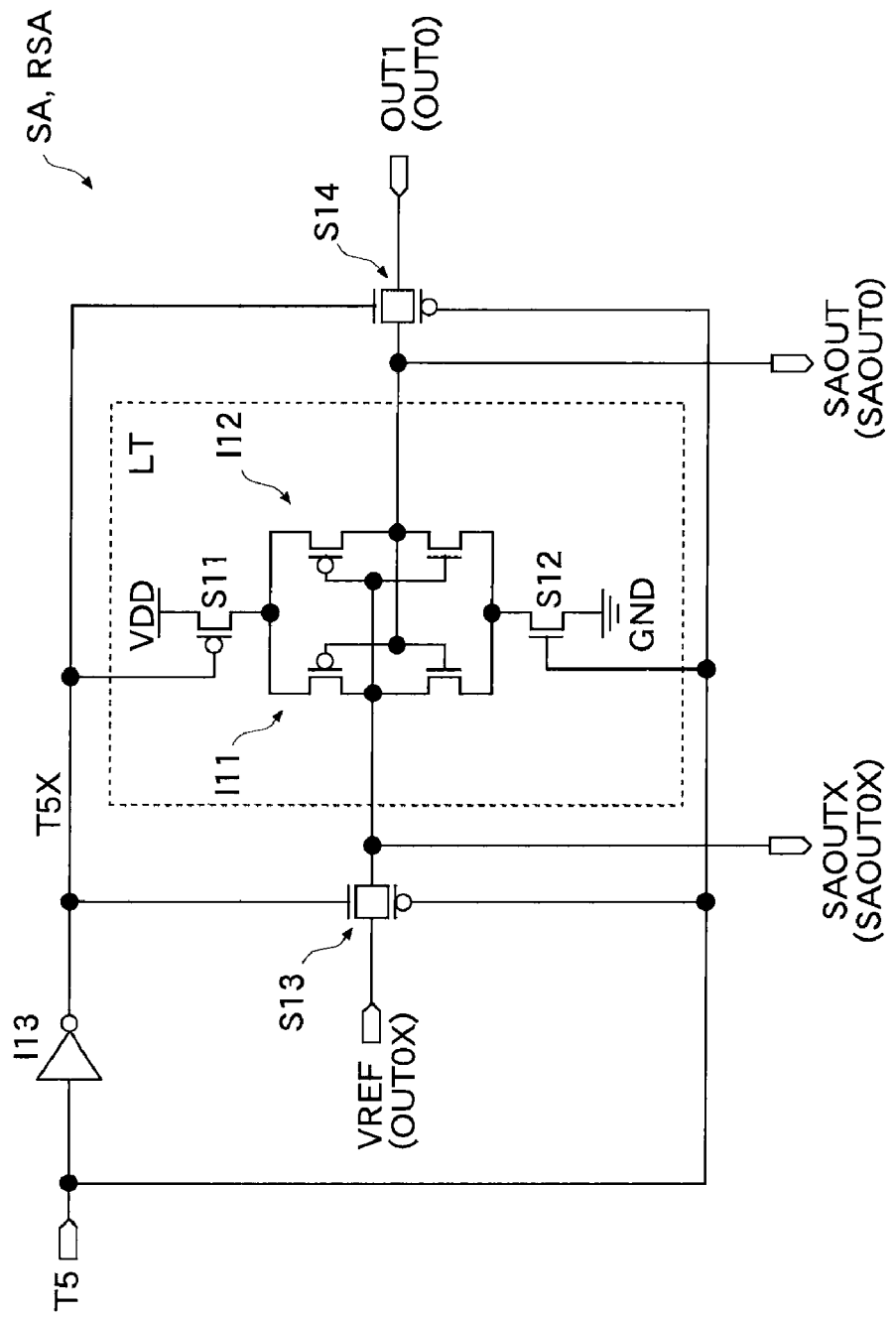
FIG. 10 illustrates a circuit diagram depicting the details of the sense amplifier illustrated in FIG. 7.

The sense amplifiers SA each differentially amplify a difference between the output signal OUT (OUT1, 2, . . . n) and the reference voltage VREF to generate complementary output signals SAOUT (SAOUT1, 2, . . . n), SAOUTX (SAOUT1X, 2X, . . . nX). The sense amplifier RSA differentially amplifies a difference between the output signals OUT0, OUT0X to generate complementary output signals SAOUT0, SAOUT0X. Details of the pre-sense amplifier PSA and the level shifter SFT are illustrated in FIG. 8. Details of the pre-sense amplifiers RPSA, the level shifters RSFT, and the voltage conversion circuit VCNV are illustrated in FIG. 9. Details of the sense amplifiers SA, RSA are illustrated in FIG. 10.

The data output buffer BUF selects, for example, 16 bits out of read data (complementary data) of a plurality of bits read from the memory core CORE according to the column decoding signal and outputs the selected read data to the data input/output terminal I/O. The data input/output terminal I/O is, for example, 16 bits. In this embodiment, read data held in the reference memory cells RMC are also output to the data input/output terminal I/O. That is, the reference memory cells RMC hold data used for generating the reference voltage VREF and also hold data (user data) used by a system accessing the ferroelectric memory.

FIG. 8 illustrates details of the regular memory cells (1T1C), the regular pre-sense amplifier PSA, and the regular level shifter SFT illustrated in FIG. 7. The regular memory cells MC each have one ferroelectric capacitor F1 and one access transistor N1 (nMOS transistor). One end of the ferroelectric capacitor F1 is coupled to the plate line PL and another end of the ferroelectric capacitor F1 is coupled to the bit line BL via the access transistor N1. A gate of the access transistor N1 is coupled to the word line WL.

The pre-sense amplifier PSA has a bit line initialization circuit 10, a charge transfer circuit 12 (charge transfer), a threshold voltage generation circuit 16, and a charge storage circuit 18. The bit line initialization circuit 10 is formed by an nMOS transistor N2 which receives a control signal BUS-GND at its gate and whose source is coupled to a ground line and whose drain is coupled to the bit line BL. The charge transfer circuit 12 is formed by a pMOS transistor P1 whose gate is coupled to an output node VTHGT of the threshold voltage generation circuit 16, whose source is coupled to the bit line BL, and whose drain is coupled to a read node VMINUS.

The threshold voltage generation circuit 16 has an inverter I1 which inverts logic level of a control signal VTHGEN to generate a control signal VTHGENX, a capacitor C1 disposed between an output of the inverter I1 and the gate (node VTHGT) of the charge transfer circuit 12, and a clamp circuit 16a coupled to the node VTHGT. The clamp circuit 16a is formed by a pMOS transistor P2 whose source is coupled to the ground line and whose gate and drain are coupled to the node VTHGT.

The charge storage circuit 18 has an inverter I2 inverting logic level of a control signal MINUSGEN to generate a control signal MINUSGENX and a capacitor C2 disposed between an output of the inverter I2 and the node VMINUS. The charge storage circuit 18 stores an electric charge read from the memory cell MC to the bit line BL during the read operation, and also generates a read voltage VMINUS according to the stored electric charge.

In this example, the capacitors C1, C2 are made of a ferroelectric material, but may be made of an insulator film or the like. Substrates of the transistors P1, P2 are coupled to the ground line, and a PN junction is formed between the drain (VMINUS or VTHGT) of each of the transistors P1, P2 and the substrate. Therefore, the nodes VMINUS and VTHGT do not have voltages higher than a forward voltage (about 0.8 V) of the PN junction.

The level shifter SFT has an initialization circuit 20 for initializing a voltage of a node VSHIFT, a source follower circuit SFC, and a regular shift capacitor C3 for converting a negative voltage generated at the node VMINUS to a positive voltage. The initialization circuit 20 has a pMOS transistor P3 and an nMOS transistor N3 which are arranged in series between a power supply line VDD and the ground line. A gate of the transistor P3 receives a reset signal RST, and a gate of the transistor N3 receives a standby signal STBY. The capacitor C3 is disposed between the node VSHIFT and the node VMINUS. In this example, the capacitor C3 is made of a ferroelectric material but may be made of a gate insulator film or the like.

The source follower circuit SFC has an nMOS transistor N4 (regular source follower transistor) and a pMOS transistor P4 (regular load circuit) which are disposed in series between the power supply line VDD and the ground line. A gate of the transistor N4 is coupled to the node VSHIFT. A gate of the transistor P4 is coupled to the node VMINUS. The source follower circuit SFC outputs the output signal OUT1 (regular shift signal) which is lower than the voltage VSHIFT by a predetermined value (threshold voltage of the transistor N4), from a source of the transistor N4.

FIG. 9 illustrates details of the reference memory cells RMC, the reference pre-sense amplifiers RPSA, the reference level shifters RSFT, and the voltage conversion circuit VCNV which are illustrated in FIG. 7. Detailed description of circuits having the same configuration as those in FIG. 8 will be omitted. In this embodiment, the pair of reference pre-sense amplifiers RPSA are coupled to the complementary reference bit lines BL0, BL0X.

The reference memory cells RMC each have a pair of access transistors N1, N2 each being an nMOS transistor, and a pair of ferroelectric capacitors F1, F2. The reference memory cells RMC have the same structure as that of the pair of regular memory cells MC. That is, the structure of each of the ferroelectric capacitors F1, F2 of the reference memory cell RMC is the same as the structure of the ferroelectric capacitor F1 of the regular memory cell MC. The ferroelectric capacitor F1 has one end coupled to the bit line BL0X via the access transistor N1 and has another end coupled to the plate line PL. The ferroelectric capacitor F2 has one end coupled to the bit line BL0 via the transfer transistor N2 and another end coupled to the plate line PL. Data whose logics are opposite to each other are written to the ferroelectric capacitors F1, F2, and their capacitance values are different from each other. Therefore, the memory cells RMC are capable of storing electric charges according to the logics of data supplied via the data input/output terminal I/O.

The circuit configurations of the pre-sense amplifiers RPSA and the level shifters RSFT are the same as the circuit configurations of the pre-sense amplifier PSA and the level shifter SFT illustrated in FIG. 8. The voltage conversion circuit VCNV is the same as the voltage conversion circuit VCNV (FIG. 5) of the third embodiment. An nMOS transistor N5 and a pMOS transistor P5 of the voltage conversion circuit VCNV in FIG. 9 correspond to the source follower transistor SF and the load circuit LD of the voltage conversion circuit VCNV in FIG. 5 respectively.

FIG. 10 illustrates details of the sense amplifiers (latch sense amplifiers) SA, RSA illustrated in FIG. 7. The sense amplifiers SA, RSA are the same circuits, and therefore, the sense amplifier SA will be described here. Signals input/output to/from the sense amplifier RSA are written in the parentheses in the drawing. The sense amplifier SA has a latch LT including a pair of inverters I11, I12 and switches S11, S12, an inverter I13, and switches S13, S14. Complementary input/output nodes SAOUT, SAOUTX of the latch LT are outputs of the sense amplifier SA. The inverter I13 inverts a timing signal T5 to output the resultant as a timing signal T5X.

The switch S11 (pMOS transistor) turns on during a high level period of the timing signal T5 in order to couple the inverters I11, I12 to the power supply line VDD. The switch S12 (nMOS transistor) turns on during the high level period of the timing signal T5 in order to couple the inverters I11, I12 to the ground line GND. The switches S13, S14 turn on during a low level period of the timing signal T5 in order to transmit level of the output signal OUT of the pre-sense amplifier PSA and the reference voltage VREF to the latch LT.

The sense amplifier SA is changed during the low level period of the timing signal T5 to stop its operation, and is activated in synchronization with a change of the timing signal T5 to high level to differentially amplify a voltage difference between the output signal OUT (node SAOUT) and the reference voltage VREF (SAOUTX). By this amplification, logic values of data read from the memory cells MC are latched by the latch LT. Further, the latched complementary data (logic values) are output as the output signals SAOUT, SAOUTX.

Figure 11:
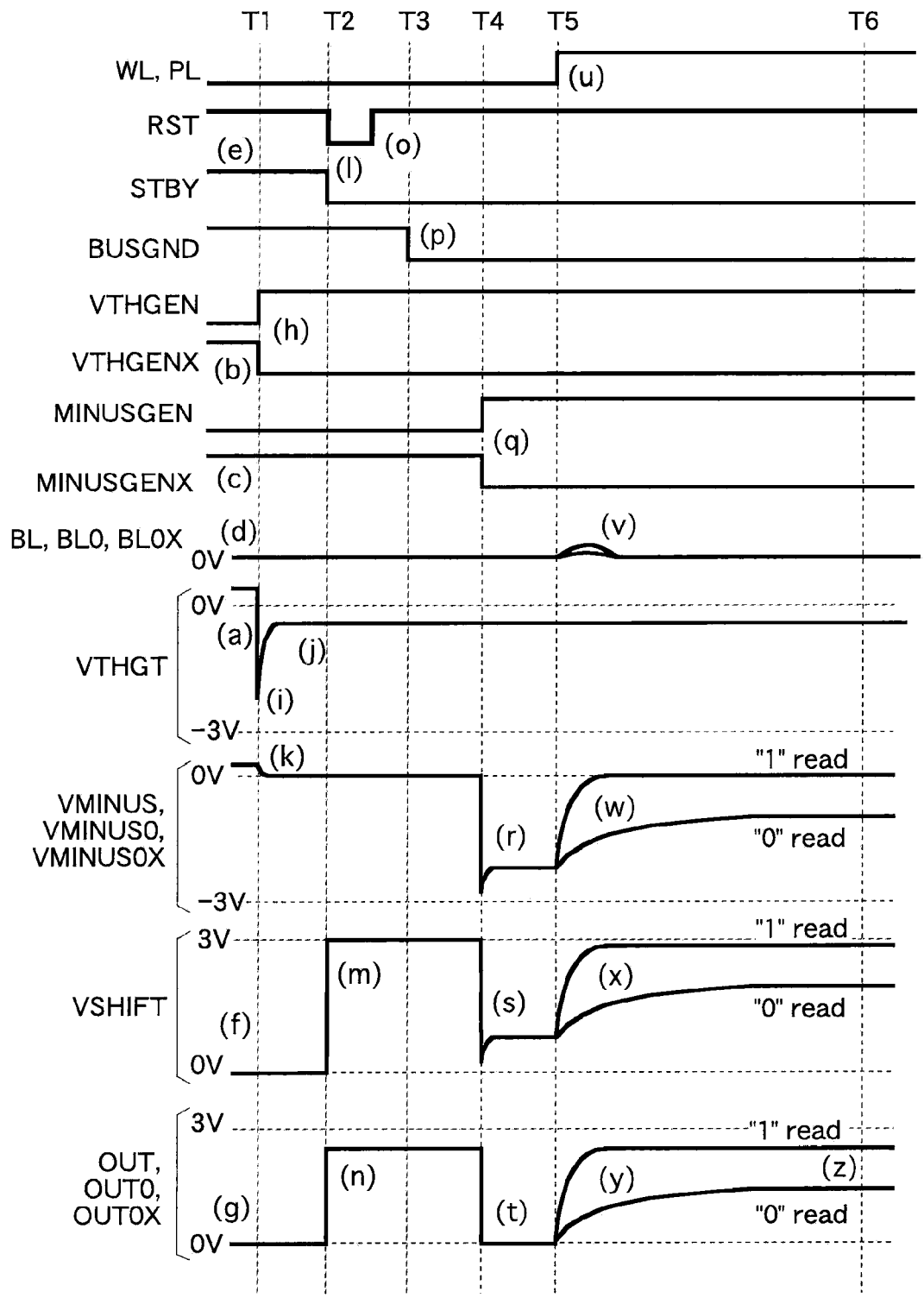
FIG. 11 illustrates a timing chart depicting a read operation of a ferroelectric memory to the fourth embodiment.

FIG. 11 illustrates the read operation of the ferroelectric memory in the fourth embodiment. Times T1-T6 in the drawing are the timings at which control signals T1-T6 are activated respectively. First, in an initial state, the nodes VTHGT and VMINUS (or VMINUS0, VMINS0X; the same hereinafter) coupled to the gate and drain of the pMOS transistor 12 (charge transfer circuit) respectively are in a floating state and thus their voltages are unstable. However, since the PN junction is formed between the drain (VMINUS) of the pMOS transistor P1 and the substrate as described above, the node VMINUS does not have a voltage higher than the forward voltage of the PN junction (FIG. 11 (a)).

The control signal VTHGEN and the control signal MINUSGEN are held in low level, and the nodes VTHGENX and MINUSGENX are held in high level (FIG. 11 (b, c)). Since the control signal BUSGND is held in high level, the nMOS transistor N2 turns on, and the voltage of the bit line BL (or BL0, BL0X; the same hereinafter) is initialized to a ground voltage (FIG. 11 (d)). The control signals RST, STBY are held in high level (FIG. 11 (e)), and the node VSHIFT is held in low level (FIG. 11 (f)). Consequently, the source follower transistor N4 turns off, and the output node OUT (or OUT0, OUTX; the same hereinafter) gets into the floating state near the ground voltage (FIG. 11 (g)).

At the time T1, the control signal VTHGEN changes to high level, and the node VTHGENX changes from high level to low level (FIG. 11 (h)). Due to capacitive coupling by the capacitor C1, the voltage of the node VTHGT also decreases in accordance with the change of the node VTHGENX to low level (FIG. 11 (i)). When a power supply voltage VDD is 3 V, in accordance with a 3 V decrease of a voltage of the node VTHGENX, the voltage of VTHGT also tries to decrease by 3 V. However, the pMOS transistor P2 (clamp circuit) clamps the voltage of the node VTHGT to a threshold voltage (for example, −0.6 V) of the pMOS transistor P2. Consequently, the voltage of the node VTHGT, after once falling, depicts a differentiated waveform to stabilize at a negative voltage (−0.6 V) (FIG. 11 (j)). In this manner, the threshold voltage generation circuit 16 operates as an initialization circuit setting the input node VTHGT of the charge transfer circuit 12 to a predetermined voltage.

A threshold voltage of the pMOS transistor P1 is designed so as to be equal to the threshold voltage of the pMOS transistor P2. Therefore, when the voltage of the node VTHGT once lowers, the pMOS transistor P1 turns on and the voltage of the node VMINUS lowers to the voltage (ground voltage) of the bit line BL, BL0, BL0X (FIG. 11 (k)). A voltage of the node MINUSGENX is set to high level (power supply voltage VDD) by the inverter I2, and therefore, the capacitor C2 is charged with an electric charge corresponding to a product of its capacitance value and the power supply voltage VDD.

At the time T2, the control signals RST, STBY change to low level, the transistor N3 of the initialization circuit 20 turns off, and the transistor P3 turns on (FIG. 11 (l)). In response to ON of the transistor P3, the node VSHIFT changes to high level (VDD) (FIG. 11 (m)). At this time, the node VMINUS is coupled to the ground line via the transistors P1, N2. Therefore, a voltage corresponding to the power supply voltage VDD is applied across both ends of the capacitor C2. The source follower transistor N4 turns on, and a voltage of the output node OUT becomes a voltage lower than the power supply voltage VDD by a threshold voltage of the transistor N4 (FIG. 11 (n)). Thereafter, the control signal RST changes to high level, and the transistor P3 turns off (FIG. 11 (o)). In response to OFF of the transistor P3, the node VSHIFT gets into the floating state, but the voltage of the node VSHIFT is kept at the power supply voltage VDD by the capacitor C3. Consequently, the voltage of the output node OUT is also kept at the voltage lower than the power supply voltage VDD by the threshold voltage of the transistor N4.

At the time T3, the control signal BUSGND changes to low level, and the bit line BL gets into the floating state (FIG. 11 (p)). However, the voltage of the bit line BL is kept substantially at the ground voltage due to parasitic capacitance thereof.

At the time T4, the control signal MINUSGEN changes to high level, and a voltage of the node MINUSGENX changes from high level to low level (FIG. 11 (q)). The voltage of the node VMINUS decreases in accordance with the decrease in the voltage of the node MINUSGENX due to the capacitive coupling of the capacitor C2 (FIG. 11 (r)). When the power supply voltage VDD is 3 V, the voltage of the node MINUSGENX decreases by 3 V, and the voltage of the node VMINUS also decreases by about 3 V. Having been initialized to 0 V, the voltage of the node VMINUS lowers to about −3 V in accordance with the voltage change of the node MINUSGENX. However, due to a loss by the parasitic capacitance, the node VMINUS changes to a voltage (for example, −2.5V) higher than −3 V. The node VMINUS is kept at this voltage by the capacitor C2. In this manner, the charge storage circuit 18 operates also as an initialization circuit which sets the input/output node VMINUS of the charge transfer circuit 12 to a predetermined voltage and sets charge transfer capability of the charge transfer circuit 12 to the initial state.

The voltage of the node VSHIFT decreases along with the voltage decrease of the node VMINUS due to the action of capacitive coupling of the capacitor C3 (FIG. 11 (s)). The transistor P4 turns on upon receiving the voltage of the node VMINUS. The transistor N4 turns off upon receiving the voltage of the node VSHIFT. Consequently, the output node OUT (or OUT0, OUT0X) is kept at the ground voltage (FIG. 11 (t)). Here, the preparation for the read operation is completed.

At the time T5, voltages of the word line WL and the plate line PL change from the ground voltage to the power supply voltage VDD (FIG. 11 (u)). Due to the activation of the word line WL, the access transistor N1 of the memory cell MC turns on and a positive voltage is applied to the ferroelectric capacitor F1, F2 of the memory cell MC. When the memory cell MC stores data "1", polarity of the voltage applied to the ferroelectric capacitor F1 is opposite to that at a write operation and thus reverse polarization occurs, and a large reverse charge is read to the bit line BL. When the memory cell MC stores data "0", polarity of the voltage applied to the ferroelectric capacitor F1 is the same as that at the time of the write operation and thus reverse polarization does not occur, and a relatively low electric charge is read to the bit line BL (FIG. 11 (v)).

At this time, the voltage of the bit line BL tries to increase. However, when the voltage of the bit line BL slightly increases, a gate-to-source voltage (absolute value) of the pMOS transistor P1 increases. Accordingly, a drain current of the pMOS transistor P2 rapidly increases, and an electric charge equal to the reverse charge is transferred from the bit line BL to the node VMINUS. Consequently, the voltage increase of the bit line BL is suppressed and the voltage is kept substantially at 0 V (ground voltage). Since the electric charge transferred to the node VMINUS causes the discharge of the capacitor C2, the voltage of the node VMINUS (read voltage) increases (FIG. 11 (w)). When the memory cell MC stores data "1", the voltage of the node VMINUS greatly increases. When the memory cell MC stores data "0", the voltage increase of the node MINUS is small. In this manner, the capacitor C2 of the charge storage circuit 18 operates as a read circuit generating a read voltage according to the stored electric charge.

In accordance with the voltage increase of the node VMINUS, the voltage of the node VSHIFT also increases due to the capacitive coupling of the capacitor C3 (FIG. 11 (x)). The voltage of the output node OUT follows the voltage of the node VSHIFT to become a voltage lower than the voltage of the node VSHIFT by the threshold voltage of the nMOS transistor N4 (FIG. 11 (y)). Therefore, the voltage of the output node OUT changes, following the voltage change of the node VMINUS.

At the time T6, as will be described later, the sense amplifier SA compares the voltage of the output node OUT with the reference voltage VREF to determine logic level held in the memory cell MC. Further, a voltage difference between the complementary output nodes OUT0, OUT0X is compared by the sense amplifier RSA and logic level held in the reference memory cell RMC is determined (FIG. 11 (z)). Then, the determined logic levels are output from the data terminal I/O as read data signals.

Figure 12:
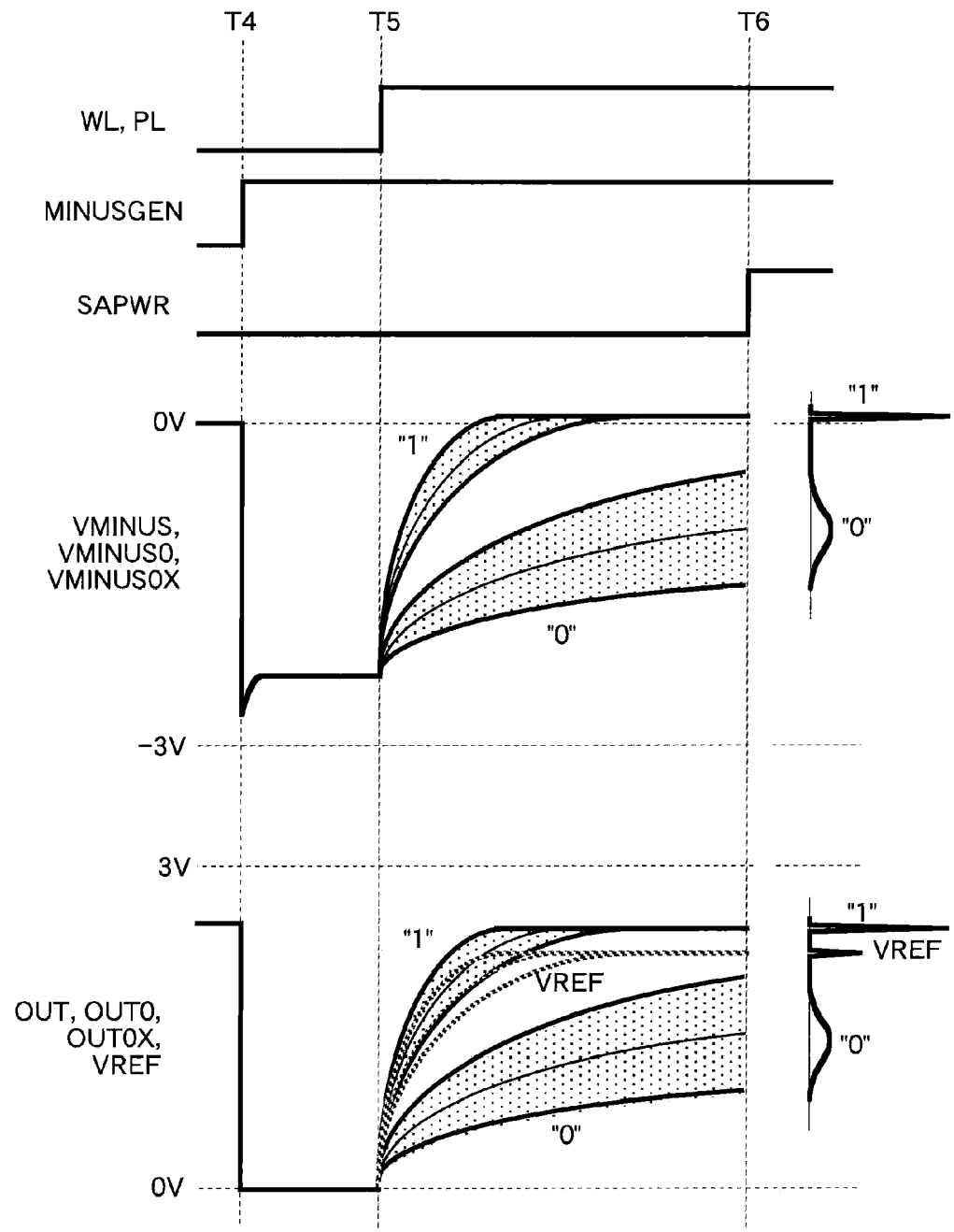
FIG. 12 illustrates a waveform chart depicting the details of the read operation illustrated in FIG. 11.

FIG. 12 illustrates details of the read operation illustrated in FIG. 11. Detailed description of the same operations as those in FIG. 11 will be omitted. Hatched portions in the drawing represent voltage fluctuations. The voltage fluctuations occur mainly due to the fluctuations of characteristics of the ferroelectric capacitors F1, F2.

The voltage of the node VMINUS (or VMINUS0, VMINUS0X; the same hereinafter) corresponding to the ferroelectric capacitor F1 (or F2; the same hereinafter) in which data "1" is written quickly rises from the voltage of the node VMINUS corresponding to the ferroelectric capacitor F1 in which the data "0" is written. Here, the capacitance values of the capacitors C2 of the pre-sense amplifiers PSA, RPSA are designed smaller than conventional ones. Therefore, the voltage of the node VMINUS corresponding to the ferroelectric capacitor F1 in which the data "1" is written increases up to an upper limit value (about ground voltage, saturation voltage) of the voltage of this node. That is, the electric charge stored in the capacitor C2 is saturated. Therefore, the voltage fluctuation of the node VMINUS is extremely small and its distribution is sharp.

The voltage of the node VMINUS corresponding to the ferroelectric capacitor F1 in which the data "0" is written does not reach the saturation voltage. In this manner, the capacitance value of the capacitor C2 is set to a value so that the voltage of the node VMINUS corresponding to the data "1" reaches the saturation voltage and the voltage of the node VMINUS corresponding to the data "0" does not reach the saturation voltage.

The output voltages OUT, OUT0, OUT0X are generated by the level shifters SFT, RSFT and are voltages following the voltage of the node VMINUS. Therefore, the distributions of the output voltages OUT, OUT0, OUT0X corresponding to the data "1" and the data "0" are the same as the distributions of the voltages of the nodes VMINUS, VMINUS0, VMINUS0X except that voltage values are different.

The reference voltage VREF is generated by the voltage conversion circuit VCNV based on the voltage of the node VMINUS0 or VMINUS0X corresponding to the data "1". Therefore, the fluctuation of the reference voltage VREF is small and its distribution is sharp similarly to the distribution of the output voltages OUT, OUT0, OUT0X corresponding to the data "1". As described above, the reference voltage VREF is lower than the output voltages OUT, OUT0, OUT0X corresponding to the data "1" by about 200 mV (first voltage).

Then, at the time T6, the sense amplifiers SA, RSA start the amplifying operation in synchronization with the timing signal T6 to latch the logic values of the read data from the regular memory cell MC and the reference memory cell RMC.

Figure 13:
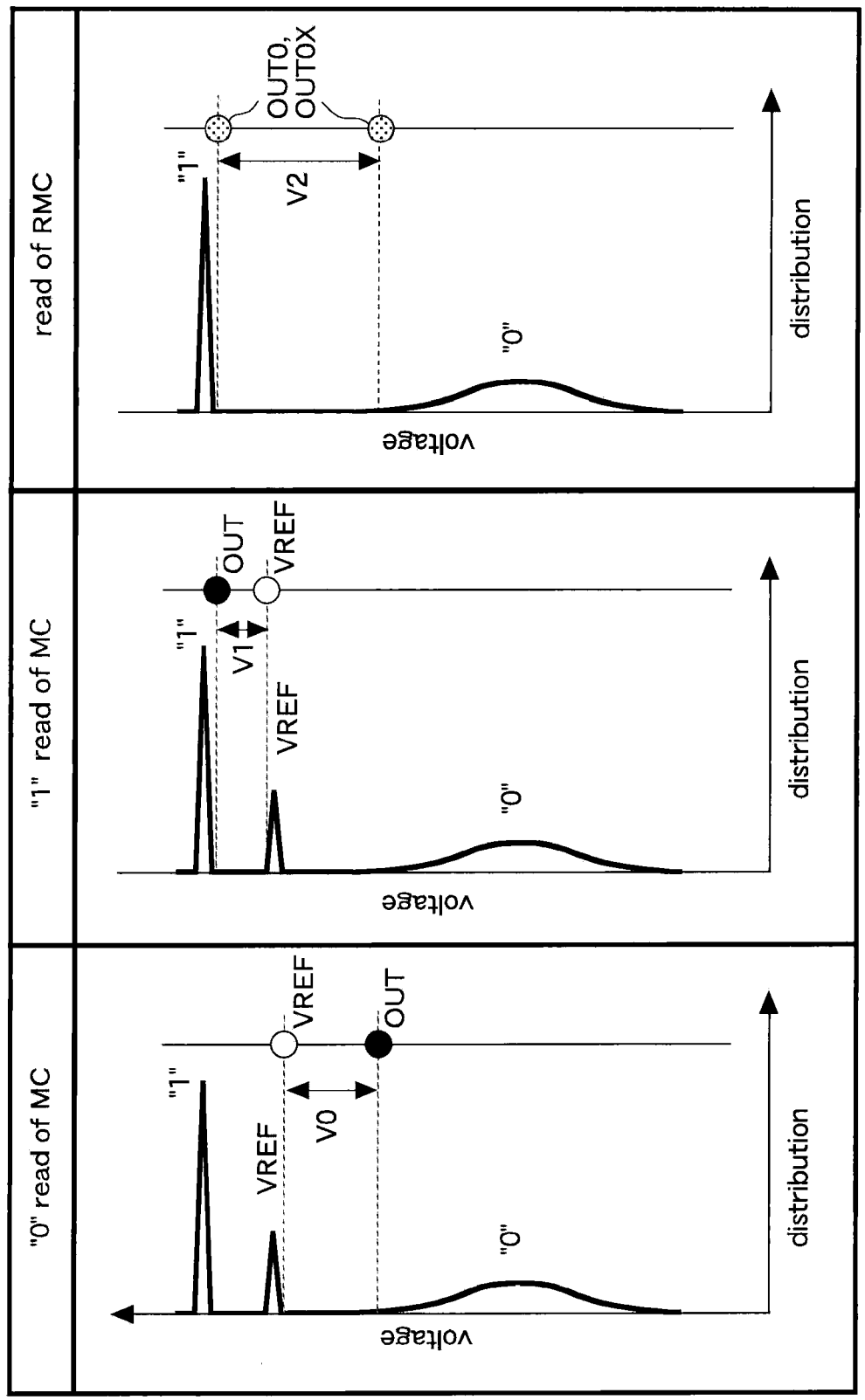
FIG. 13 illustrates an explanatory diagram of a read margin in the read operation illustrated in FIG. 12.

FIG. 13 illustrates a read margin in the read operation illustrated in FIG. 12. The distributions in the drawing are the same as the distributions of the output voltages OUT, OUT0, OUT0X and the reference voltage VREF illustrated in FIG. 12. White circles in the drawing represent worst values of the reference voltage VREF. Black circles in the drawing represent worst values of the output voltage OUT. Hatched circles in the drawing represent worst values of the output voltages OUT0, OUT0X.

The number of samples forming the distribution of the data "1" and the number of samples forming the distribution of the data "0" are equal to each other. The number of the reference memory cells RMC coupled to one word line WL (for example, one) is smaller than the number of the regular memory cells MC (for example, 15), and therefore, the number of samples forming the distribution of the reference voltage VREF is smaller than the number of samples of the output voltages OUT, OUT0, OUT0X corresponding to the data "1". However, a width of the distribution of the reference voltage VREF (fluctuation of the voltage) is the same as that of the distribution of the output voltages OUT, OUT0, OUT0X corresponding to the data "1" and is extremely small.

In the read operation of the regular memory cell MC storing the data "0", a difference V0 between the output voltage OUT and the reference voltage VREF becomes smallest when the output voltage OUT is largest (upper end of the distribution) and the reference voltage VREF is smallest (lower end of the distribution). At this time, the read margin is smallest. A minimum value of the difference voltage V0 is, for example, 300 mV.

On the other hand, in the read operation of the regular memory cell MC storing the data "1", a difference V1 between the output voltage OUT and the reference voltage VREF becomes smallest when the output voltage OUT is smallest (lower end of the distribution) and the reference voltage VREF is largest (upper end of the distribution). At this time, the read margin is smallest. The voltage conversion circuit VCNV is designed so that the reference voltage VREF is always lower than the output voltage OUT0 (or OUT0X) corresponding to the data "1" by 200 mV. That is, a difference between the center of the distribution of the reference voltage VREF and the center of the distribution of the output voltage OUT0 (or OUT0X) corresponding to the data "1" is 200 mV. Incidentally, a width of the distribution of the output voltage OUT0 (or OUT0X) corresponding to the data "1" and a width of the reference voltage VREF each is about 50 mV, for instance, and at this time, the difference voltage V1 is 150 mV.

In the read operation of the data "0", the sense amplifier SA illustrated in FIG. 10 differentially amplifies the difference voltage V0 and latches the read data. Further, in the read operation of the data "1", the sense amplifier SA differentially amplifies the difference voltage V1 and latches the read data. Generally, the sense amplifier SA illustrated in FIG. 10 is capable of sufficient amplification and latching for input signals if an input amplitude is about 100 mV. Therefore, the sense amplifier SA is capable of amplifying and latching a voltage difference of the input signals to read correct data.

On the other hand, in the read operation of the reference memory cell RMC, the pair of memory cells MC store complementary data. Therefore, the sense amplifier RSA only need to differentially amplify a difference V2 between the output voltages OUT0, OUT0X. Since the difference voltage V2 is about 500 mV, the sense amplifier RSA is capable of surely reading correct data.

Figure 14:
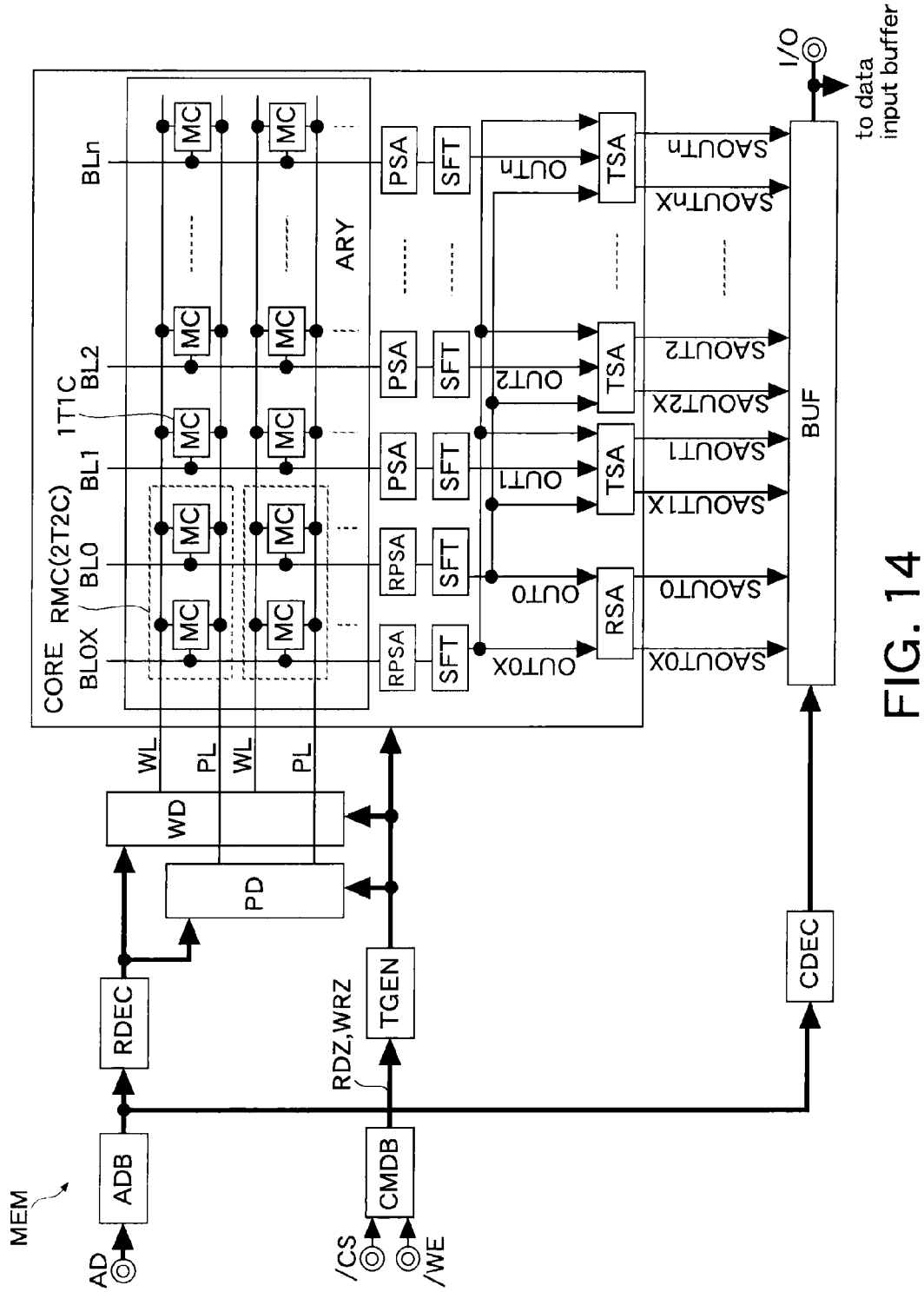
FIG. 14 illustrates a block diagram depicting a ferroelectric memory studied by the inventor.

FIG. 14 illustrates a ferroelectric memory studied by the inventor. The same elements as those described in the fourth embodiment will be designated by identical reference numbers or symbols, and detailed description thereof will be omitted. This semiconductor memory MEM does not have the voltage conversion circuit VCNV, and in place of the reference level shifters RSFT and the sense amplifiers SA coupled to the regular bit lines BL (BL1, BL2, . . . BLn) in FIG. 7, level shifters SFT and twin sense amplifiers TSA are formed. The other structure is the same as that in FIG. 7.

Figure 15:
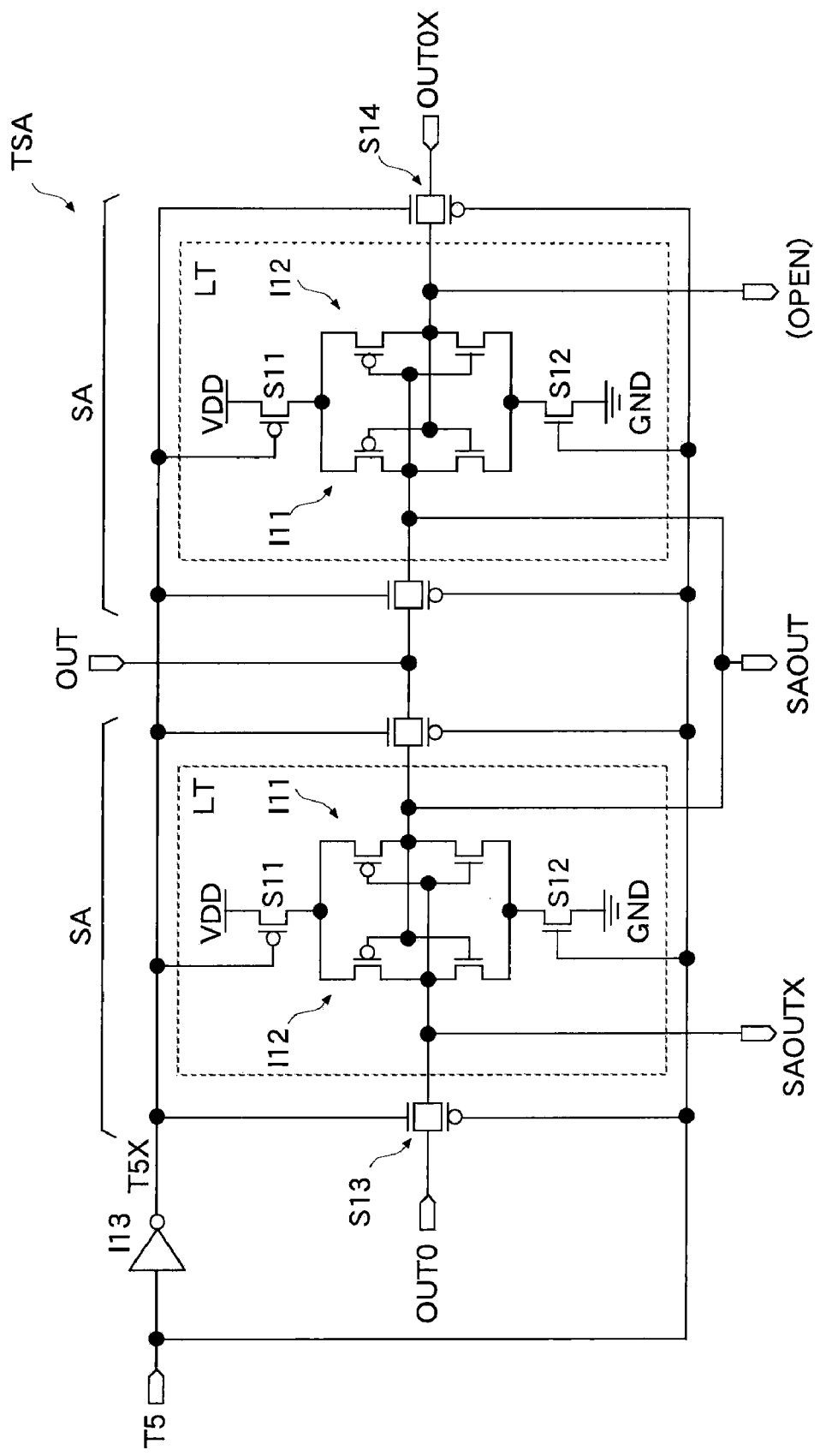
FIG. 15 illustrates a circuit diagram depicting the details of the twin sense amplifiers illustrated in FIG. 14.

FIG. 15 illustrates details of the twin sense amplifier TSA illustrated in FIG. 14. The twin sense amplifier TSA has a pair of latches LT. In the twin sense amplifier TSA, one of complementary inputs of each of the latches LT receives a reference output signal OUT0 or OUT0X corresponding to a reference memory cell RMC, and the other one of the complementary inputs receives a regular output signal OUT (OUT1, 2, . . . n) corresponding to a regular memory cell MC.

Each of the latches LT is inactivated during a low level period of a timing signal T5 to stop its operation and is activated in synchronization with a change of the timing signal T5 to high level, similarly to the latch LT of the sense amplifier SA illustrated in FIG. 10. In response to the activation of the timing signal T5 to high level, a voltage difference between the output signal OUT (node SAOUT) and the output signal OUT0 and a voltage difference between the output signal OUT and the output signal OUT0X are differentially amplified.

For example, when the reference memory cell RMC store data "1", owing to the operations of a pre-sense amplifier RPSA and a level shifter SFT, a voltage of the output signal OUT0 becomes relatively higher than a voltage of the output signal OUT0X. Hereinafter, waveforms of the output signals OUT0, OUT0X corresponding to the data "1" will be referred to as waveforms "1", and waveforms of the output signals OUT0, OUT0X corresponding to data "0" will be referred to as waveforms "0". When the regular memory cell MC stores the data "1", the voltage of the output signal OUT is substantially equal to the voltage of the output signal OUT0 (waveform "1").

At this time, the latch LT on the left in the drawing receive substantially equal voltages (waveforms "1") at the both inputs and thus becomes meta-stable for a short time (for example, 10 ns). Therefore, sufficient differential amplification is not performed, and it takes a long time for the voltage difference between output signals SAOUT, SAOUTX to become large. On the other hand, since the both inputs of the latch LT on the right in the drawing receive the waveform "1" and the waveform "0" which have a large voltage difference, the amplifying operation and the latch operation are performed without delay. Consequently, a voltage of the output signal SAOUT common to the pair of latches LT increases up to a power supply voltage VDD. Since the output signal SAOUT is activated, the latch LT on the left in the drawing also performs the differential amplification and a latch state is fixed. Then, the output signal SAOUTX changes to low level (ground voltage). That is, complementary data "1" and data "0" are output from nodes SAOUT, SAOUTX.

Figure 16:
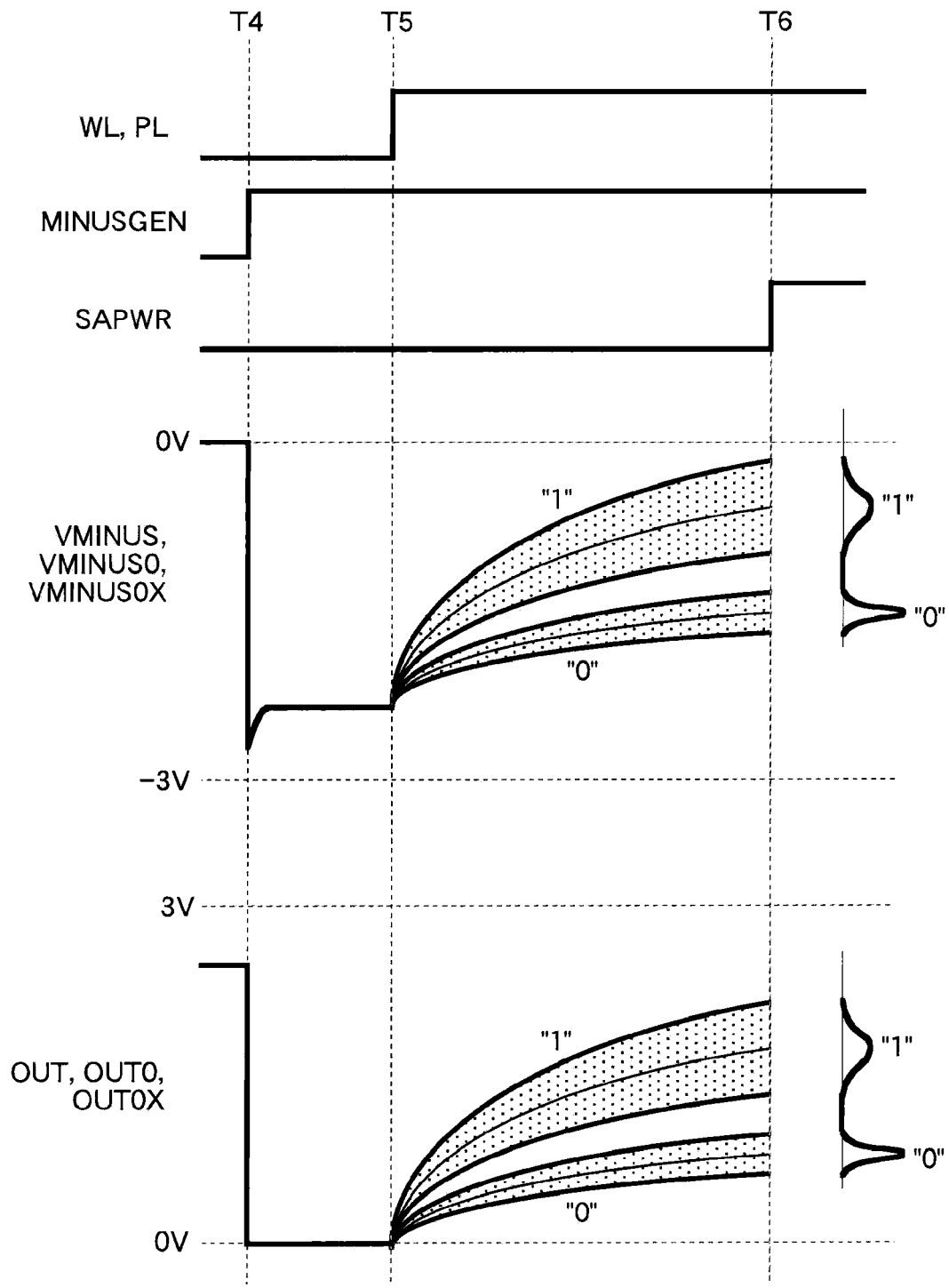
FIG. 16 illustrates a waveform chart depicting a read operation of the ferroelectric memory illustrated in FIG. 14.

FIG. 16 illustrates details of a read operation of the ferroelectric memory MEM illustrated in FIG. 14. Detailed description of the same operations as those in FIG. 11 and FIG. 12 will be omitted. Hatched portions in the drawing represent voltage fluctuation. In the ferroelectric memory MEM illustrated in FIG. 14, capacitance values of capacitors C2 (FIG. 9) of the pre-sense amplifiers PSA, RPSA are designed so that voltages of nodes VMINUS, VMINUS0, VMINUS0X at a time T6 do not exceed a ground voltage (0 V). That is, the capacitance values of the capacitors C2 in FIG. 4 are larger than the capacitance values of the capacitors C2 in the fourth embodiment. In this case, a voltage change of the waveform "1" is larger than a voltage change of the waveform "0".

Figure 17:
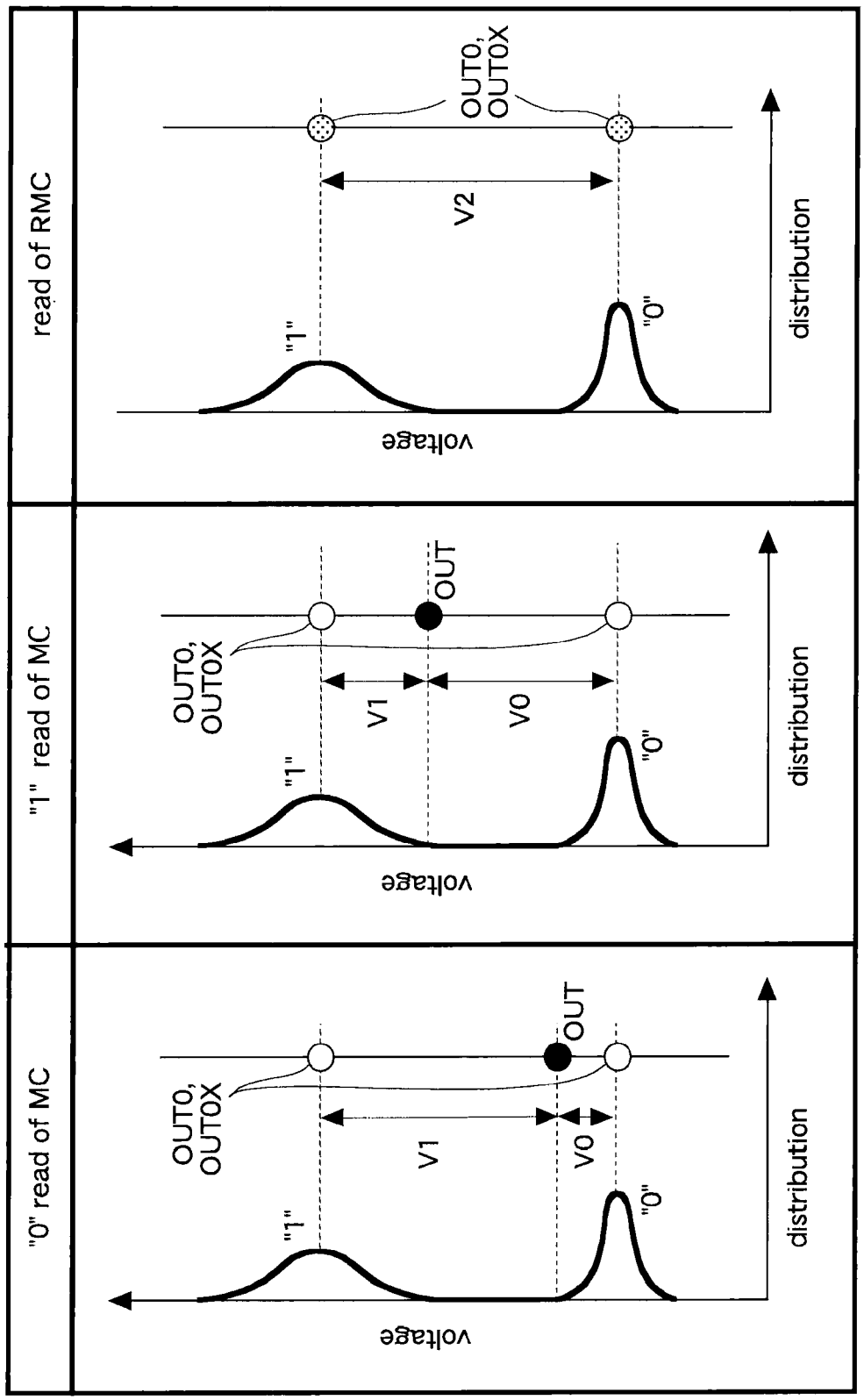
FIG. 17 illustrates an explanatory diagram depicting a read margin when a normal read operation is performed in the ferroelectric memory illustrated in FIG. 14.

FIG. 17 illustrates a read margin when a normal read operation is performed in the ferroelectric memory MEM illustrated in FIG. 14. The distributions in the drawing are the same as the distributions of the output voltages OUT, OUT0, OUT0X illustrated in FIG. 16. White circles in the drawing represent the complementary output voltages OUT0, OUT0X acting as the reference voltage. In this example, the output voltage OUT0 or OUT0X corresponding to the data "1" is equal to an average value of the output voltages OUT corresponding to the regular memory cell MC holding the data "1". The output voltage OUT0 or OUT0X corresponding to the data "0" is equal to an average value of the output voltage OUT corresponding to the regular memory cell MC holding the data "0". Black circles in the drawing represent worst values of the output voltage OUT. Hatched circles in the drawing represent average output voltages OUT0, OUT0X.

A difference voltage V0 is a difference between the output voltage OUT and the output voltage OUT0 or OUT0X corresponding to the data "0". A difference voltage V1 is a difference between the output voltage OUT and the output voltage OUT0 or OUT0X corresponding to the data "1". A difference voltage V2 is a difference between the output voltage OUT0 (or OUT0X) corresponding to the data "0" and the output voltage OUT0X (or OUT0) corresponding to the data "1".

In the read operation of the regular memory cell MC storing the data "0", the difference voltage V1 is sufficiently larger than the difference voltage V0. Therefore, one of the pair of latches LT of the twin sense amplifier TSA can obtain a sufficiently large input amplitude. Therefore, the meta-stable state of the other one of the pair of latches LT can be quickly cancelled, and the data "0" stored in the regular memory cell MC is surely read. Similarly, in the read operation of the regular memory cell MC storing the data "1", the difference voltage V0 is sufficiently larger than the difference voltage V1. Therefore, one of the pair of latches LT of the twin sense amplifier TSA can obtain a sufficiently large input amplitude. Therefore, the data "1" stored in the regular memory cell MC is surely read.

On the other hand, in the read operation of the reference memory cell RMC, the pair of memory cells MC store complementary data. Therefore, the sense amplifier RSA only has to differentially amplify the difference V2 between the output voltages OUT0, OUT0X. The difference voltage V2 corresponds to the sum of the difference voltages V1, V2 and is sufficiently large. Therefore, the sense amplifier RSA is capable of surely reading correct data.

Figure 18:
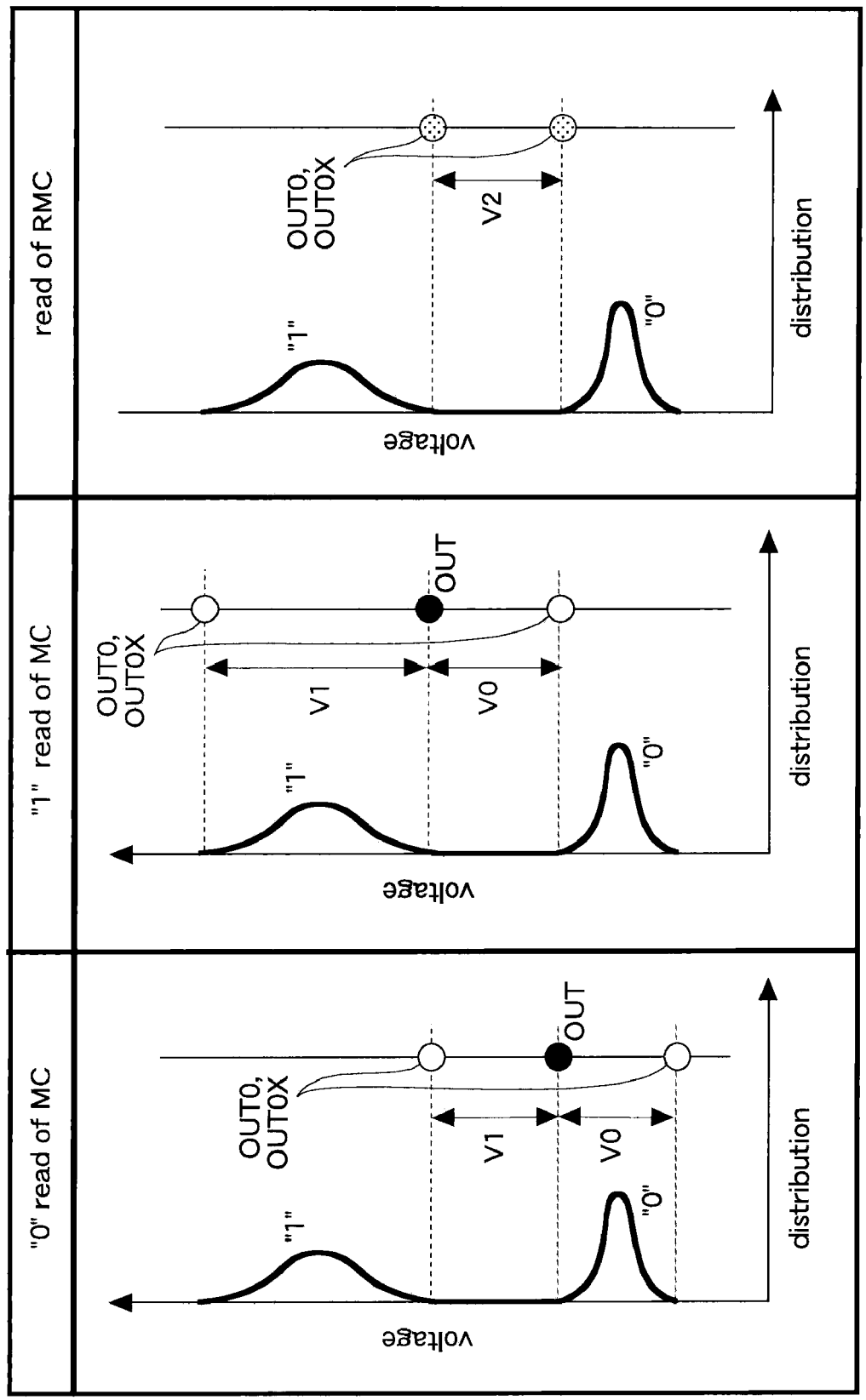
FIG. 18 illustrates an explanatory diagram depicting a worst read margin when an erroneous read operation is performed in the ferroelectric memory illustrated in FIG. 14.

FIG. 18 illustrates a worst read margin when an erroneous read operation is performed in the ferroelectric memory MEM illustrated in FIG. 14. The notation in the drawing is the same as that in FIG. 13 and FIG. 17.

In the read operation of the regular memory cell MC storing the data "0", it is assumed that the output voltages OUT0, OUT0X corresponding to the data "1" and the data "0" are in a lower end of the distribution. At this time, the difference voltages V1, V0 are substantially equal. In the twin sense amplifier TSA, the latch LT receiving the output voltage OUT0 (or OUT0X) corresponding to the data "1" tries to amplify the data "0". On the other hand, the other latch LT receiving the output voltage OUT0X (or OUT0) corresponding to the data "0" tries to amplify the data "1". When the amplification performance of the other latch is slightly higher, the twin sense amplifier TSA latches the data "1". That is, erroneous read data is output.

In the read operation of the regular memory cell MC storing the data "1", it is assumed that the output voltages OUT0, OUT0X corresponding to the data "1" and the data "0" are in an upper end of the distribution. In this example, the difference voltage V1 is larger than the difference voltage V0, and the twin sense amplifier ISA amplifies the data "0" and latches the resultant. That is, erroneous read data is output.

Incidentally, in the read operation of the reference memory cell RMC, it is assumed that the output voltage OUT0 (or OUT0X) corresponding to the data "1" is in a lower end of the distribution and the output voltage OUT0X (or OUT0) corresponding to the data "0" is in an upper end of the distribution. The difference V2 between the output voltages OUT0, OUT0X is sufficiently large. Therefore, the sense amplifier RSA is capable of surely reading correct data.

The fourth embodiment described above can also provide the same effects as those of the first, second, and third embodiments described above. In particular, in the semiconductor memory MEM having the memory cells MC, RMC including the ferroelectric capacitors F1, F2 whose capacitance values are likely to fluctuate, the read margin can be improved.

Figure 19:
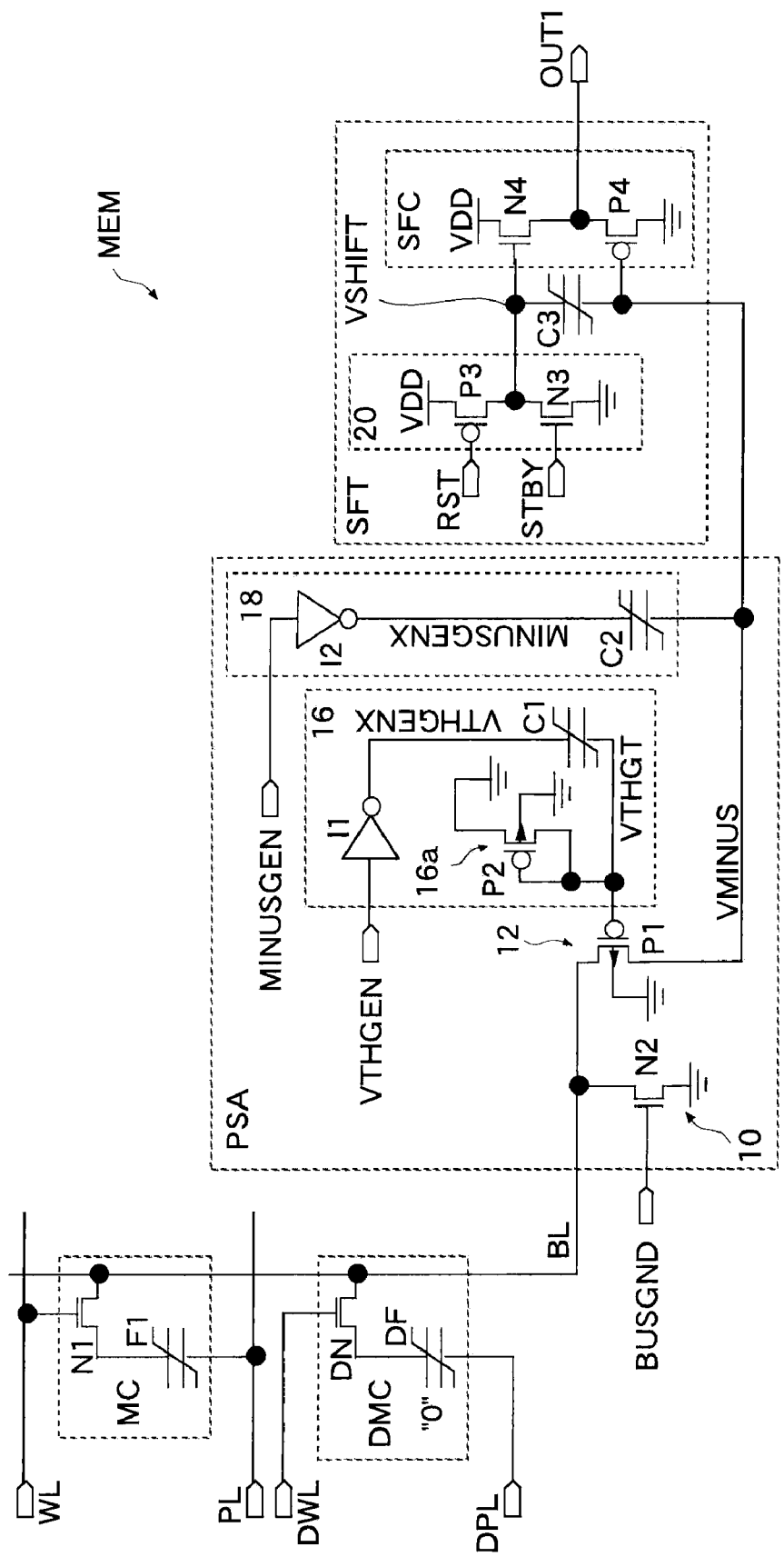
FIG. 19 illustrates a circuit diagram depicting a substantial part to a fifth embodiment.
Figure 20:
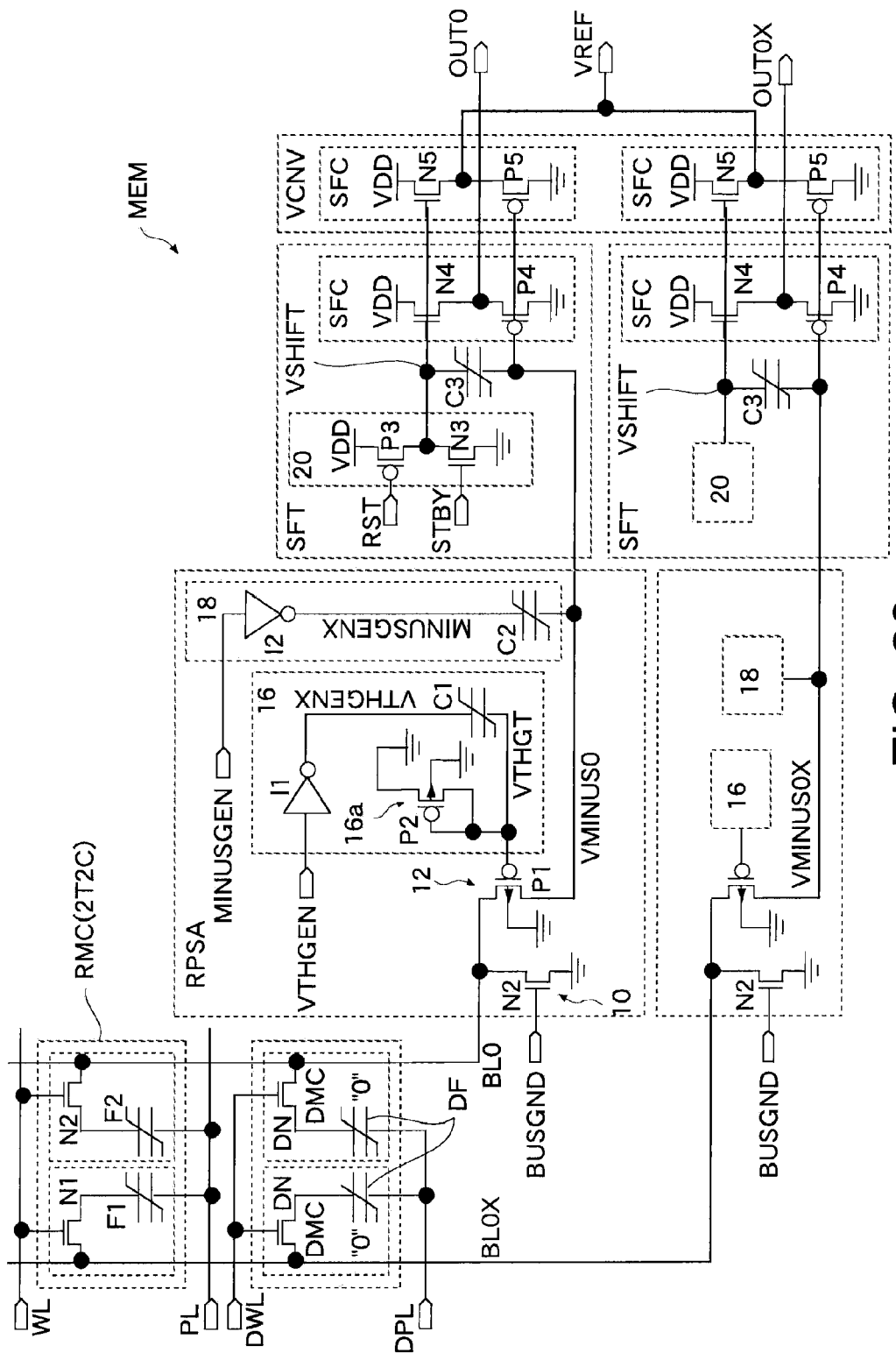
FIG. 20 illustrates a circuit diagram depicting a substantial part to a fifth embodiment.

FIG. 19 and FIG. 20 illustrate substantial parts of a fifth embodiment. The same elements as those described in the above-described embodiments will be designated by identical reference numbers or symbols, and detailed description thereof will be omitted. In this embodiment, dummy memory cells DMC are added to the ferroelectric memory MEM of the fourth embodiment. Capacitance values of pre-sense amplifiers PSA, RPSA are larger than those in the fourth embodiment. The other structure is the same as that of the fourth embodiment (FIG. 8 and FIG. 9).

The dummy memory cells DMC are coupled to a regular bit line BL in FIG. 19 (actually, one of BL1, BL2, . . . BLn in FIG. 7) and reference bit lines BL0 and BL0X in FIG. 20. The dummy memory cells DMC each have a dummy capacitor DF whose one end is coupled to a dummy plate line DPL and whose another end is coupled to the bit line BL, BL0, or BL0X via a dummy access transistor DN. A gate of the dummy access transistor DN is coupled to a dummy word line WL. For example, the dummy capacitor DF is formed by a variable capacitor such as a ferroelectric capacitor. The dummy memory cell DMC coupled to the bit line BL has the same structure as that of the regular memory cell MC. The pair of dummy memory cells DMC coupled to the bit lines BL0, BLX have the same structure as the reference memory cell RMC.

Prior to a read operation, the dummy capacitors DF are set to capacitance values so that they can store an electric charge corresponding to data "0" (low logic level). That is, the dummy capacitors DF of the dummy memory cells DMC always hold data "0". For example, the dummy capacitors DF coupled to the complementary bit lines BL0, BL0X in FIG. 20 are both required to hold data "0". Therefore, the ferroelectric memory MEM has a dummy write circuit (not shown) which sets both the reference bit lines BL0, BL0X to "0" level (for example, ground voltage). During a re-write period after the read operation or prior to the read operation, the dummy write circuit operates to write data "0" to the dummy capacitors DF coupled to the bit lines BL0, BL0X respectively.

The dummy word line DWL is driven to high level by the word driver WD illustrated in FIG. 7 at the same timing as the word line WL (time T5 in FIG. 11). The dummy plate line DPL is driven to high level by the plate driver PD illustrated in FIG. 7 at the same timing as the plate line PL (time T5 in FIG. 11). The dummy word line DWL and the dummy plate line DPL change to high level at every read operation regardless of a value of a row decoding signal.

In this embodiment, at the time T5 illustrated in FIG. 11, when the word line WL and the plate line PL are activated, the dummy word line DWL and the dummy plate line PL are also activated. Consequently, to the bit line BL (or BL0, BL0X), not only an electric charge read from a ferroelectric capacitor F1 of the regular memory cell MC (or ferroelectric capacitors F1, F2 of the dummy memory cells DMC) but also an electric charge read from the dummy ferroelectric capacitor DF of the dummy memory cell DMC is read.

An electric charge amount read from the dummy ferroelectric capacitor DF is equal to an electric charge amount read from the ferroelectric capacitor F1 holding the data "0". Therefore, it is possible to increase an electric charge amount transferred to a node VMINUS, VMINUS0, VMINUS0X via a transistor P1, and waveforms in the read operation become the same as the waveforms in FIG. 11 and FIG. 12 described above.

The fifth embodiment described above can also provide the same effects as those of the above-described embodiments. In addition, in this embodiment, by utilizing the dummy memory cells DMC, it is possible to increase read voltages VMINUS, VMINUS0 (or VMINUS0X) corresponding to data "1" and output voltages OUT, OUT0 (or OUT0X) to a saturation voltage. As a result, it is possible to provide the semiconductor memory MEM having a high read margin by using existing pre-sense amplifiers PSA, RPSA.

Figure 21:
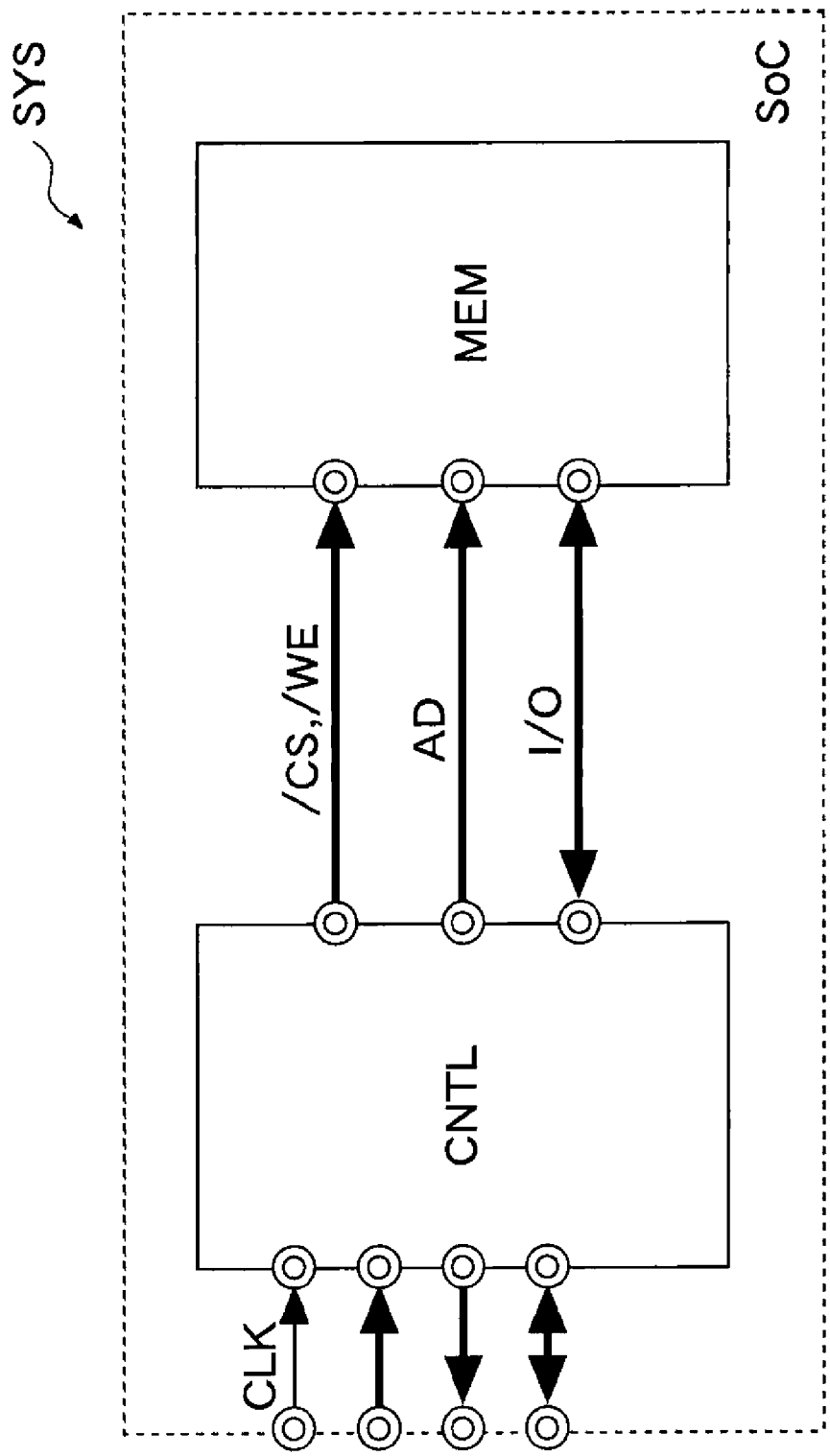
FIG. 21 illustrates a block diagram depicting an outline of a system embedded the semiconductor memory of one of the first through fifth embodiments.

FIG. 21 illustrates an outline of a system in which the semiconductor memory MEM of one of the first to fifth embodiments described above is embedded. For example, a system SYS has a controller CNTL and the semiconductor memory MEM which are mounted on one chip and is formed as a system-on-chip SoC. The controller CNTL is, for example, an ASIC core having a CPU for accessing the memory MEM. An external source coupled to the system SYS accesses the memory MEM via the controller CNTL. The memory MEM may be of a type synchronizing with a clock signal CLK.

Incidentally, in the above-described fourth and fifth embodiments, the examples in which the present embodiment is applied to the ferroelectric memory is described. The present embodiment is not limited to such embodiments. For example, the present embodiment may be applied to another semiconductor memory having memory cells each including a capacitor which retains logic values of data in the form electric charges.

In the above-described fifth embodiment, the example is described where the dummy capacitor DF is coupled to the bit line BL, BL0, or BL0X via the dummy access transistor DN. The present embodiment is not limited to such an embodiment. For example, the dummy capacitor DF may be coupled directly to the bit line BL, BL0, or BL0X. In this case, the dummy capacitor DF may be made of a gate insulator film or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory comprising:
   a regular memory cell having a cell capacitor storing an electric charge corresponding to one of a high logic level and a low logic level;
   a regular pre-sense amplifier having a regular capacitor which is saturated by the electric charge read from the regular memory cell holding the high logic level and from which a saturation voltage is read, and which is not saturated by the electric charge held in the regular memory cell holding the low logic level and from which a read voltage lower than the saturation voltage is read, and generating a regular read voltage corresponding to the electric charge being stored;
   a reference memory cell having a cell capacitor storing the electric charge corresponding to the high logic level;
   a reference pre-sense amplifier having a reference capacitor which is saturated by the electric charge read from the reference memory cell holding the high logic level and from which the saturation voltage is read, and generating the saturation voltage as a reference read voltage;

a differential sense amplifier differentially amplifying a difference between the regular read voltage and a reference voltage which is lower than the reference read voltage by a first voltage to generate logic of data held in the regular memory cell; and a voltage conversion circuit being arranged between an output of the reference pre-sense amplifier and an input of the differential sense amplifier and generating the reference voltage.

2. The semiconductor memory according to claim 1, wherein the reference voltage is higher than the read voltage that is lower than the saturation voltage.

3. The semiconductor memory according to claim 1, comprising:

a regular bit line coupled to the regular memory cell; and
a reference bit line coupled to the reference memory cell, wherein:

the regular pre-sense amplifier has:

a regular charge transfer circuit coupled to the regular bit line; and a regular charge storage circuit coupled to the regular charge transfer circuit via a regular read node, including the regular capacitor which stores the electric charge read from the regular memory cell to the regular bit line during a read operation, and generating the regular read voltage at the regular read node according to the electric charge stored in the regular capacitor; and the reference pre-sense amplifier has:

a reference charge transfer circuit coupled to the reference bit line; and a reference charge storage circuit coupled to the reference charge transfer circuit via a reference output node, including the reference capacitor which stores the electric charge corresponding to the high logic level read from the reference memory cell to the reference bit line during the read operation, and generating the reference read voltage at a reference read node according to the electric charge stored in the reference capacitor.

4. The semiconductor memory according to claim 3, comprising dummy memory cells each coupled to the regular bit line and the reference bit line and each outputting electric charges to the regular bit line and the reference bit line during the read operation.

5. The semiconductor memory according to claim 4, wherein the dummy memory cells store the electric charges corresponding to the low logic level.

6. The semiconductor memory according to claim 3, comprising:

a regular level shifter coupled to the regular pre-sense amplifier and generating a regular shift voltage of which the regular read voltage is shifted by a predetermined value; and a reference level shifter coupled to the reference pre-sense amplifier and generating a reference shift voltage of which the reference read voltage is shifted by the predetermined value, wherein:

the voltage conversion circuit generates the reference voltage which is lower than the reference shift voltage by the first voltage; and the differential sense amplifier receives the regular shift voltage as the regular read voltage and differentially amplifies a difference between the regular shift voltage and the reference voltage.

7. A semiconductor memory comprising:

a regular memory cell having a cell capacitor storing an electric charge corresponding to one of a high logic level and a low logic level;

a regular pre-sense amplifier having a regular capacitor which is saturated by the electric charge read from the regular memory cell holding the high logic level and from which a saturation voltage is read, and which is not saturated by the electric charge held in the regular memory cell holding the low logic level and from which a read voltage lower than the saturation voltage is read, and generating a regular read voltage corresponding to the electric charge being stored;

a reference memo having first and second cell capacitors each storing complementary electric charges corresponding to the high logic level and the low logic level;

a first reference pre-sense amplifier having a reference capacitor which is saturated by the electric charge corresponding to the high logic level read from the first cell capacitor and from which the saturation voltage is read, and which is not saturated by the electric charge corresponding to the low logic level read from the first cell capacitor and from which a read voltage lower than the saturation voltage is read, and generating a first reference read voltage;

a second reference pre-sense amplifier having a reference capacitor which is saturated by the electric charge corresponding to the high logic level read from the second cell capacitor and from which the saturation voltage is read, and which is not saturated by the electric charge corresponding to the low logic level read from the second cell capacitor and from which a read voltage lower than the saturation voltage is read, and generating a second reference read voltage;

a voltage conversion circuit generating a reference voltage based on one of the first and second reference read voltages from the first and second reference pre-sense amplifiers; and a sense amplifier generating logic of data held in the regular memory cell based on a difference between the regular read voltage and the reference voltage.

8. The semiconductor memory according to claim 7, comprising:

a regular level shifter coupled to the regular pre-sense amplifier and generating a regular shift voltage of which the regular read voltage is shifted by a predetermined value;

a first reference level shifter coupled to the first reference pre-sense amplifier and generating a first reference shift voltage of which the first reference read voltage is shifted by the predetermined value; and a second reference level shifter coupled to the second reference pre-sense amplifier and generating a second reference shift voltage of which the second reference read voltage is shifted by the predetermined value, wherein:

the voltage conversion circuit generates a third reference shift voltage which is lower by a first voltage than a voltage corresponding to the high level voltage among the first reference shift voltage and the second reference shift voltage; and the sense amplifier generating logic of data held in the regular memory cell based on a difference between the regular shift voltage and the third reference shift voltage.

9. The semiconductor memory according to claim 8, wherein:

the regular level shifter has: a regular shift capacitor whose one end is coupled to the regular read node; a regular source follower transistor having a gate coupled to another end of the regular shift capacitor and outputting the regular shift voltage from a source; and a regular load circuit coupled to the source of the regular source follower transistor;

the first reference level shifter has: a first reference shift capacitor whose one end is coupled to a first reference read node; a first reference source follower transistor having a gate coupled to another end of the first reference shift capacitor and outputting the first reference shift voltage from a source; and a first reference load circuit coupled to the source of the first reference source follower transistor;

the second reference level shifter has: a second reference shift capacitor whose one end is coupled to a second reference read node; a second reference source follower transistor having a gate coupled to another end of the second reference shift capacitor and outputting the second reference shift voltage from a source; and a second reference load circuit coupled to the source of the second reference source follower transistor;

the voltage conversion circuit has first and second source follower circuits which are coupled to the first and second reference level shifters respectively and whose outputs are coupled to each other;

the first source follower circuit has: a first source follower transistor having a gate coupled to another end of the first reference shift capacitor and outputting the reference voltage from a common output; and a first load circuit coupled to the source of the first source follower transistor; and the second source follower circuit has: a second source follower transistor having a gate coupled to another end of the second reference shift capacitor and outputting the reference voltage from a common output; and a second load circuit coupled to the source of the second source follower transistor.

10. The semiconductor memory according to claim 8, further comprising a differential sense amplifier differentially amplifying a difference between the first reference shift voltage and the second reference shift voltage, and generating logic of data held in the reference memory cell.

11. The semiconductor memory according to claim 9, wherein:

the regular load circuit is a transistor whose gate is coupled to the regular read node;

the first reference load circuit and the first load circuit are each a transistor whose gate is coupled to the first reference read node; and the second reference load circuit and the second load circuit are each a transistor whose gate is coupled to the second reference read node.

* * * * *